US009960181B1

(12) United States Patent
Cui et al.

(10) Patent No.: US 9,960,181 B1
(45) Date of Patent: May 1, 2018

(54) THREE-DIMENSIONAL MEMORY DEVICE HAVING CONTACT VIA STRUCTURES IN OVERLAPPED TERRACE REGION AND METHOD OF MAKING THEREOF

(71) Applicant: SANDISK TECHNOLOGIES LLC, Plano, TX (US)

(72) Inventors: Zhixin Cui, Yokkaichi (JP); Masahiro Wada, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 15/488,924

(22) Filed: Apr. 17, 2017

(51) Int. Cl.
| | |
|---|---|
| H01L 23/522 | (2006.01) |
| H01L 27/115 | (2017.01) |
| H01L 27/11582 | (2017.01) |
| H01L 23/528 | (2006.01) |
| H01L 21/28 | (2006.01) |
| H01L 21/768 | (2006.01) |
| H01L 21/311 | (2006.01) |
| H01L 21/027 | (2006.01) |
| H01L 27/11565 | (2017.01) |

(52) U.S. Cl.
CPC .... *H01L 27/11582* (2013.01); *H01L 21/0273* (2013.01); *H01L 21/28282* (2013.01); *H01L 21/31111* (2013.01); *H01L 21/76802* (2013.01); *H01L 21/76877* (2013.01); *H01L 23/528* (2013.01); *H01L 23/5226* (2013.01); *H01L 27/11565* (2013.01)

(58) Field of Classification Search
CPC ............. H01L 23/5226; H01L 23/5283; H01L 27/11573; H01L 27/11582
See application file for complete search history.

(56) References Cited

U.S. PATENT DOCUMENTS

| 5,915,167 A | 6/1999 | Leedy |
| 8,884,357 B2 | 11/2014 | Wang et al. |

(Continued)

OTHER PUBLICATIONS

U.S. Appl. No. 15/015,190, filed Feb. 4, 2016, SanDisk Technologies Inc.

(Continued)

*Primary Examiner* — Cuong Q Nguyen
(74) *Attorney, Agent, or Firm* — The Marbury Law Group PLLC

(57) ABSTRACT

Contact areas for three-dimensional memory devices including multiple vertically stacked tier structures can be reduced by overlapping stepped terraces of the tier structures. Sacrificial via structures laterally surrounded by a respective insulating spacer can be formed through an overlying tier structure in the stepped terrace region thereof. After formation of memory stack structures, the sacrificial via structures can be removed to provide first upper via cavities. An isotropic etch can be performed to extend the first upper via cavities to top surfaces of underlying first electrically conductive layers in an underlying tier structure while forming second upper via cavities extending to second electrically conductive layers in the overlying tier structure. First contact via structures extending through the terrace region of the overlying tier structure can provide electrical contact to the first electrically conductive layers, and second contact via structure can be formed in the second upper via cavities.

12 Claims, 29 Drawing Sheets

(56) References Cited

U.S. PATENT DOCUMENTS

| | | |
|---|---|---|
| 8,946,023 B2 | 2/2015 | Makala et al. |
| 9,230,987 B2 | 1/2016 | Pachamuthu et al. |
| 9,356,034 B1 | 5/2016 | Yada et al. |
| 9,449,982 B2 | 9/2016 | Lu et al. |
| 9,502,429 B2 | 11/2016 | Hironaga |
| 9,502,471 B1 | 11/2016 | Lu et al. |
| 9,570,463 B1 | 2/2017 | Zhang et al. |
| 9,576,967 B1 | 2/2017 | Kimura et al. |
| 9,589,981 B2 | 3/2017 | Nishikawa et al. |
| 9,595,535 B1 | 3/2017 | Ogawa et al. |
| 9,601,502 B2 | 3/2017 | Sano et al. |
| 9,627,403 B2 | 4/2017 | Liu et al. |
| 2015/0036407 A1 | 2/2015 | Nakajima et al. |
| 2016/0148835 A1 | 5/2016 | Shimabukuro et al. |
| 2016/0204117 A1 | 7/2016 | Liu et al. |
| 2016/0365351 A1 | 12/2016 | Nishikawa et al. |
| 2017/0062454 A1 | 3/2017 | Lu et al. |
| 2017/0236746 A1* | 8/2017 | Yu ............... H01L 23/5226 257/314 |
| 2017/0263642 A1* | 9/2017 | Nishikawa ........ H01L 27/11582 |
| 2017/0294383 A1* | 10/2017 | Tanzawa ............. H01L 23/5226 |
| 2017/0352678 A1* | 12/2017 | Lu .................. H01L 27/11582 |

OTHER PUBLICATIONS

U.S. Appl. No. 15/175,450, filed Jun. 7, 2016, SanDisk Technologies Inc.

U.S. Appl. No. 15/180,902, filed Jun. 13, 2016, SanDisk Technologies Inc.

U.S. Appl. No. 15/186,768, filed Jun. 20, 2016, SanDisk Technologies Inc.

U.S. Appl. No. 15/243,260, filed Aug. 22, 2016, SanDisk Technologies Inc.

U.S. Appl. No. 15/251,374, filed Aug. 30, 2016, SanDisk Technologies Inc.

U.S. Appl. No. 15/274,451, filed Sep. 23, 2016, SanDisk Technologies Inc.

U.S. Appl. No. 15/367,791, filed Dec. 2, 2016, SanDisk Technologies Inc.

U.S. Appl. No. 15/451,773, filed Mar. 7, 2017, SanDisk Technologies LLC.

U.S. Appl. No. 15/489,050, filed Apr. 17, 2017, SanDisk Technologies LLC.

* cited by examiner

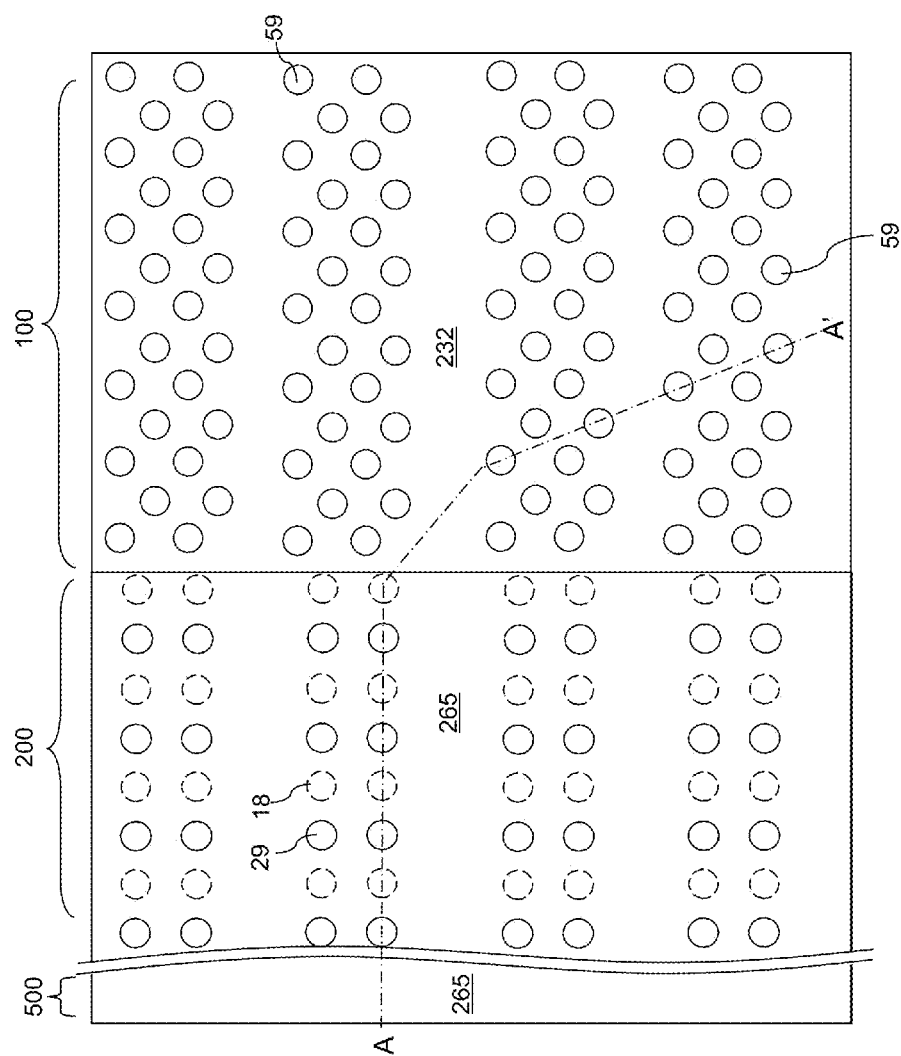

THREE-DIMENSIONAL MEMORY DEVICE HAVING CONTACT VIA STRUCTURES IN OVERLAPPED TERRACE REGION AND METHOD OF MAKING THEREOF

FIELD

The present disclosure relates generally to the field of semiconductor devices and specifically to three-dimensional non-volatile memory devices, and specifically to a three-dimensional memory device having contact via structures extending through an overlapped, stacked terrace region and methods of making the same.

BACKGROUND

High density storage devices employing Bit Cost Scalable (BiCS) architecture include an array of memory stack structures that extend through an alternating stack of insulating layers and electrically conductive layers. Such devices include 3D NAND stacked memory devices that employ a three-dimensional array of memory elements. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

SUMMARY

According to an aspect of the present disclosure, a three-dimensional memory device contains a first tier structure including a first alternating stack of first insulating layers and first electrically conductive layers that is located over a top surface of a substrate and having a first terrace region containing first steps, a second tier structure including a second alternating stack of second insulating layers and second electrically conductive layers that overlies the first tier structure and having a second terrace region containing second steps that overlies the first steps in the first terrace region, a memory array region located adjacent to the first terrace region and the second terrace region and including memory stack structures that extend through the first alternating stack and the second alternating stack, wherein each of the memory stack structures comprises a memory film and a vertical channel, and first contact via structures vertically extending through the second tier structure in the second terrace region and extending into the first tier structure in the first terrace region and contacting a respective one of the first electrically conductive layers.

According to another aspect of the present disclosure, a method of forming a semiconductor structure includes forming a first tier structure including a first alternating stack of first insulating layers and first spacer material layers that has a first terrace region containing first steps over a top surface of a substrate, forming a second tier structure including a second alternating stack of second insulating layers and second spacer material layers that overlies the first tier structure and has a second terrace region containing second steps that overlies the first steps in the first terrace region, forming memory stack structures through the first alternating stack and the second alternating stack in a memory array region located adjacent to the first terrace region and the second terrace region, wherein each of the memory stack structures comprises a memory film and a vertical semiconductor channel, replacing the first and second spacer material layers with respective first and second electrically conductive layers, and forming first contact via structures through the second tier structure in the second terrace region and into the first tier structure in the first terrace region directly on a respective one of the first electrically conductive layers.

BRIEF DESCRIPTION OF THE DRAWINGS

FIG. 9B is a top-down view of the exemplary structure of FIG. 9A.

DETAILED DESCRIPTION

Figure 1:
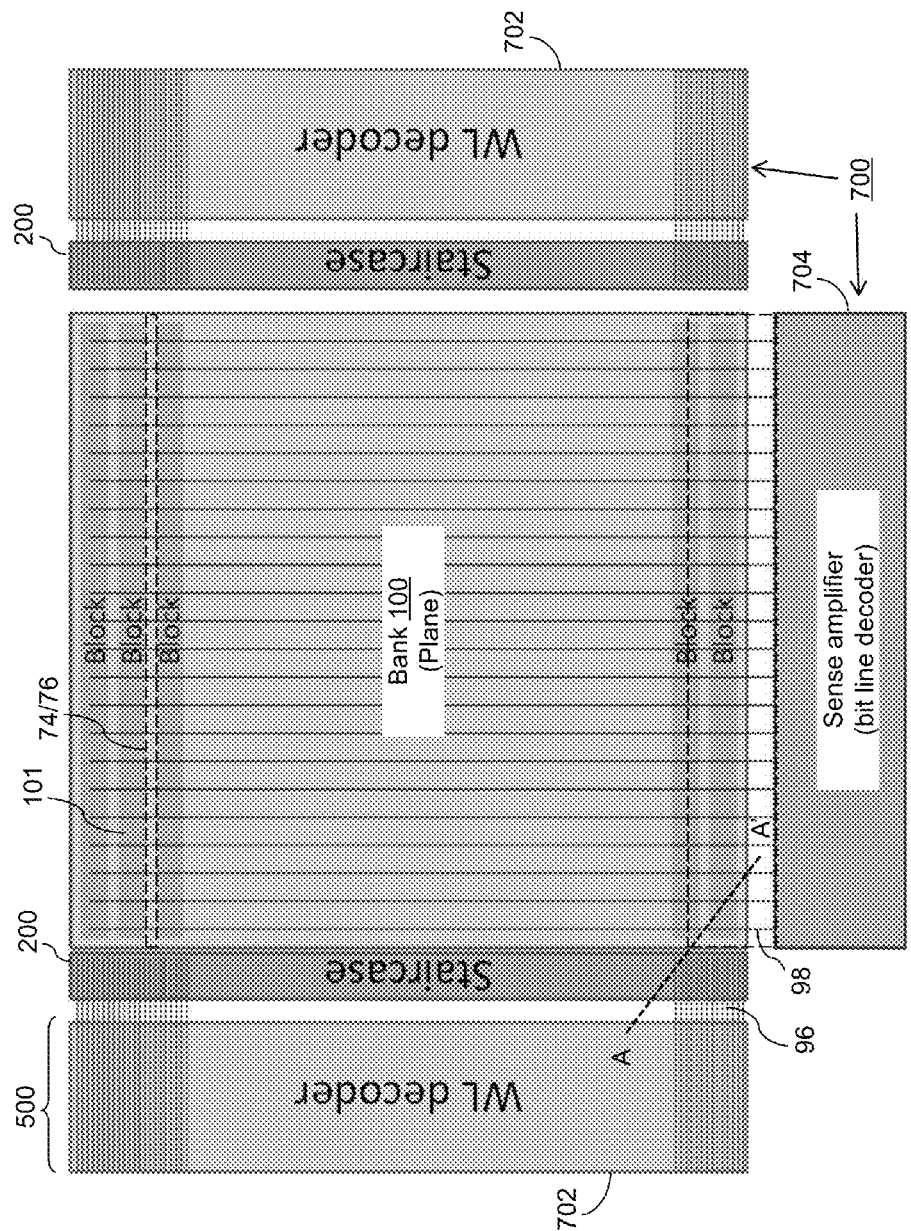
FIG. 1 is a schematic top layout view of a three-dimensional (3D) NAND chip in which the word line decoder circuitry and the bit line decoder circuitry are located in a peripheral region that is separate from the memory array region.

Terrace regions in which underlying electrically conductive layers laterally extend farther than overlying electrically conductive layers are employed to provide electrical contact to the word lines of the three-dimensional memory devices. As the total number of layers in the three-dimensional memory device increases, the area of the terrace regions increases correspondingly. Thus, a method is desired for providing electrical contact to each of the electrically conductive layers in the alternating stack while minimizing the total area for the terrace regions.

As discussed above, embodiments of the present disclosure are directed to a three-dimensional memory device employing contact via structures extending through an overlapped, stacked terrace region and methods of making the same, the various aspects of which are described below. This configuration reduces the total area for the terrace (i.e., staircase) regions. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, any two or more measurable quantities are "substantially the same" if each of the two or more measurable quantities do not deviate from the average of the two or more measurable quantities by more than 2.5% of the average of the two or more measurable quantities. For example, a first lateral distance is substantially the same as a second lateral distance if the first lateral distance and the second lateral distance do not deviate from the average of the first lateral distance and the second lateral distance by more than 2.5% of the average of the first lateral distance and the second lateral distance.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-peripheral-stack" element refers to an element that vertically extends through one or more peripheral alternating stacks in one or more tier structures.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Referring to FIG. 1, a layout of a three-dimensional (3D) NAND chip is illustrated in which the word line decoder circuitry 702 and the bit line decoder circuitry 704 are located in peripheral device region(s) 700 are separate from the memory array region 100 containing memory cells. Region 100 can also be referred to as a 3D NAND bank, plane or a page which is located in a rectangular area. A plurality of NAND strings are arranged in NAND memory blocks 101 separated by trenches 79 filled with an insulating spacer 74 and optional backside contact via structure 76. Word line decoder circuitry 702 (which is also referred to as a row decoder circuitry or a "ROWDEC circuitry") controls the voltages applied to the word lines of the memory array region (i.e., the 3D NAND bank) 100. Word line contact via regions 200 can be provided adjacent to the memory array region 100 so that vertical contact via structures to the word lines can be formed in the staircase areas. In one embodiment of the present disclosure, the word line contact via regions 200 are provided only on the word line decoder circuitry 702 sides of the memory array region 100 to permit metal lines 96 (schematically illustrated as horizontal lines between pairs of a staircase containing word line contact via region 200 and a word line decoder circuitry 702) to provide electrical connection between the word lines extending from the memory array region 100 into the staircase region 200 and the word line decoder circuitry 702. A sense amplifier circuitry 704 (which is also referred to as a bit line decoder circuitry or a "page buffer" circuitry) controls voltage applied to the bit lines 98 (which are schematically illustrated as vertical lines extending over the memory array region and to the sense amplifier circuitry) controls voltages applied to the bit lines, detects the status of individual memory cells within the memory array region (for example, during a read operation), and latches the status of the individual memory cells. Optionally, the sense amplifier circuitry 704 may also extend under the memory array region 100, as shown by the dashed lines. Preferably, there are no dummy staircase regions on the sense amplifier circuitry 704 side of the memory array region 100. The word line decoder circuitry 702 can be embodied as two blocks of peripheral device regions 700 located adjacent to the word line contact via regions 200, and the sense amplifier circuitry 704 can be located in an area that is 90 degrees rotated from one of the word line decoder circuitry areas to enable connection with all of the bit lines.

The areas of the word line decoder circuitry and the sense amplifier circuitry are not negligible as a fraction of the entire area of the semiconductor chip. The total areas of the word line decoder circuitry and the sense amplifier circuitry can easily exceed 20% of the total chip area, and may exceed 30% of the total chip area for some 3D NAND memory devices. The total areas of the word line decoder circuitry and the sense amplifier circuitry as a fraction of the total area of a 3D NAND memory chip is expected to increase even further as the total number of word lines (as implemented as electrically conductive layers in a vertical stack) increases in a high density 3D NAND memory device. Thus, it is desirable to reduce the fraction of the areas that are employed for the word line decoder circuitry and the sense amplifier circuitry over the total chip area in a 3D NAND memory device.

Figure 2:
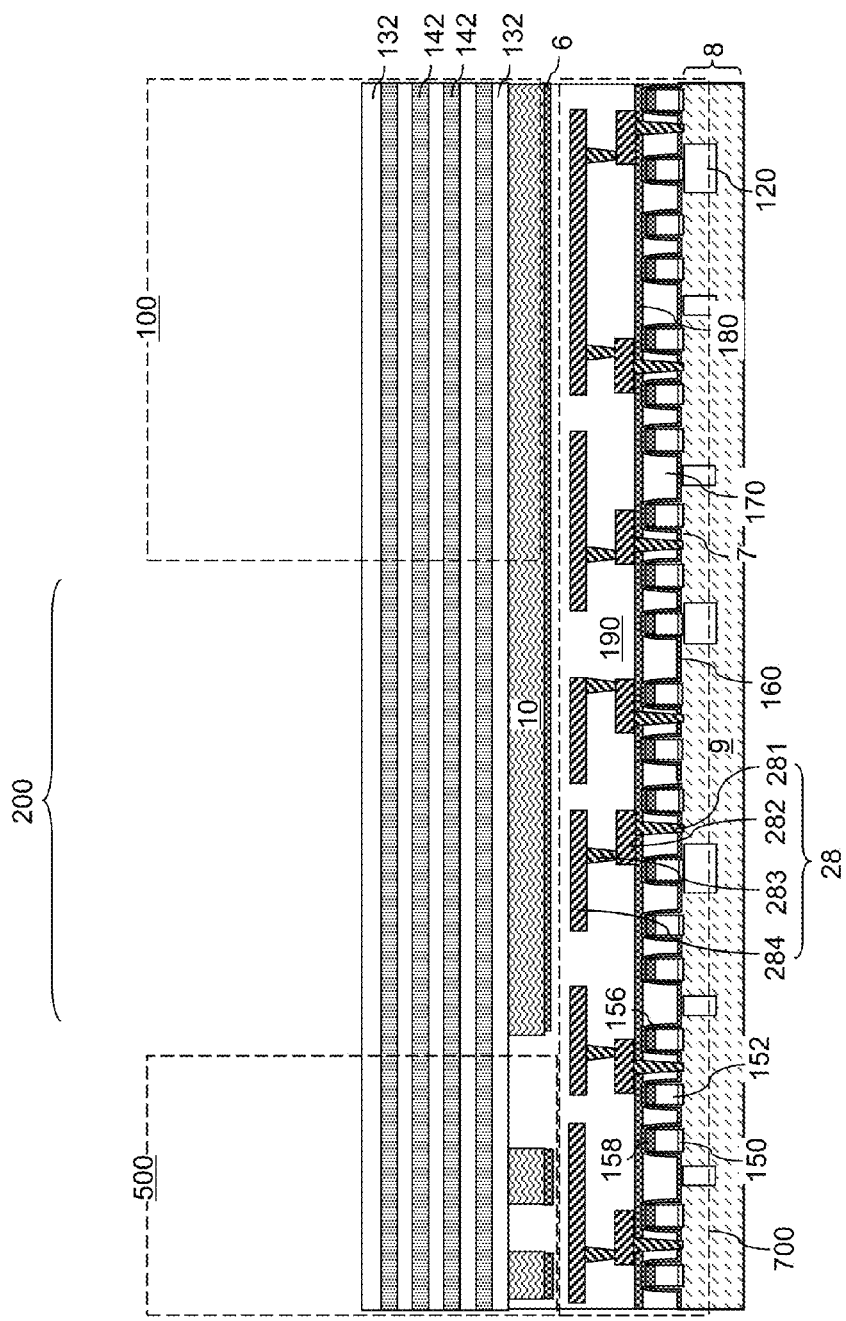
FIG. 2 is a vertical cross-sectional view of an exemplary structure after formation and patterning of a first alternating stack of first insulating layers and first spacer material layers according to a first embodiment of the present disclosure.

Referring to FIG. 2, an exemplary structure according to an embodiment of the present disclosure is illustrated. The exemplary structure includes a substrate 8, which can include a substrate semiconductor layer 9 at least in an upper portion thereof. Various semiconductor devices can be formed on, or over, the substrate semiconductor layer 9 employing methods known in the art. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The semiconductor substrate 8 has a major surface 7, which can be, for example, a topmost surface of the substrate semiconductor layer 9. The major surface 7 can be a semiconductor surface. In one embodiment, the major surface 7 can be a single crystalline semiconductor surface. In one embodiment, the substrate semiconductor layer 9 is a silicon wafer containing doped wells.

Shallow trench isolation structures 120 can be formed in an upper portion of the substrate semiconductor layer 9 to provide electrical isolation among the semiconductor devices. The semiconductor devices can include, for example, field effect transistors including respective source regions (which are doped surface portions of the substrate semiconductor layer 9), drain regions (which are additional doped surface portions of the substrate semiconductor layer 9), channel regions (which are portions of the substrate semiconductor layer 9) located between a pair of a source region and a drain region, and gate structures (150, 152, 158). Each gate structure (150, 152, 158) can include a gate dielectric 150, a gate electrode 152, and a gate cap dielectric 158. A gate spacer 156 can be provided around each gate structure (150, 152, 158). The field effect transistors may be arranged in a CMOS configuration.

The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed and sense amplifier devices located under the word line contact via regions 200 and/or under the memory array region 100.

At least one dielectric layer is formed over the semiconductor devices, which is herein referred to as at least one lower-interconnect-level dielectric material layer (160, 170, 180, 190). The at least one lower-interconnect-level dielectric material layer (160, 170, 180, 190) can include, for example, an optional dielectric liner 160 such as a silicon nitride liner that blocks diffusion of mobile ions and/or applies appropriate stress to underlying structures, a planarization dielectric layer 170 that is employed to provide a planar surface that is coplanar with the topmost surface of the dielectric liner 160 or the topmost surfaces of the gate structures (150, 152, 158), an optional planar liner 180, and at least one lower-interconnect-level dielectric material layer 190 that collectively functions as a matrix for lower-interconnect-level metal interconnect structures 28 that provide electrical wiring among the various nodes of the semiconductor devices and landing pads for through-memory-level via structures to be subsequently formed.

The lower-interconnect-level metal interconnect structures 28 are embedded in at least one lower-interconnect-level dielectric material layer (160, 170, 180, 190), and are formed over the peripheral devices. The lower-interconnect-level metal interconnect structures 28 can include various device contact via structures 281 (e.g., source and drain electrodes which contact the respective source and drain nodes of the device or gate electrode contacts), lower level metal lines 282, lower level via structures 283, and lower level topmost metal structures 284 that are configured to function as landing pads for through-memory-level via structures to be subsequently formed.

The region of the semiconductor devices and the combination of the at least one lower-interconnect-level dielectric material layer (160, 170, 180, 190) and the lower-interconnect-level metal interconnect structures 28 is herein referred to as a peripheral device region 700, which can include an area underneath the memory array region 100 to be subsequently formed and includes peripheral devices for the memory array region 100. The lower-interconnect-level metal interconnect structures 28 are embedded in the at least one lower-interconnect-level dielectric material layer (160, 170, 180, 190). In one embodiment, the topmost surfaces of the lower level topmost metal structures 284 may be located at or below a horizontal plane including the topmost surface of the at least one lower-interconnect-level dielectric material layer (160, 170, 180, 190).

The lower-interconnect-level metal interconnect structures 28 can be electrically shorted to nodes (e.g., source regions, drain regions, or gate electrodes 152) of the semiconductor devices (e.g., CMOS devices) on the substrate semiconductor layer 9, and are located at the level of the at least one lower-interconnect-level dielectric material layer (160, 170, 180, 190). In one embodiment, the pattern of the lower-interconnect-level metal interconnect structures 28 can be selected such that the lower level topmost metal structures 284, which are a subset of the lower-interconnect-level metal interconnect structures 28 that is located at the topmost level of the lower-interconnect-level metal interconnect structures 28, can provide landing pad structures within a through-memory-level via region 500. The through-memory-level via region 500 is a region in which through-memory-level via structures that extend vertically through a memory-level assembly are subsequently formed. The first exemplary semiconductor structure can further include a memory array region 100 in which a memory array is subsequently formed, and a word line contact via region 200 (i.e., the staircase region) in which word line contact via structures are subsequently formed.

An optional planar material layer 6 and a planar semiconductor layer 10 can be formed over the peripheral device region 700. In one embodiment, an upper portion of the at least one lower-interconnect-level dielectric material layer (160, 170, 180, 190) may be recessed in the memory array region 100, and the optional planar material layer 6 and the planar semiconductor layer 10 may be formed in the recessed region of the at least one lower-interconnect-level dielectric material layer (160, 170, 180, 190). In another embodiment, the optional planar material layer 6 and the planar semiconductor layer 10 may be deposited as planar material layers over the at least one lower-interconnect-level dielectric material layer (160, 170, 180, 190), and a portion of the optional planar material layer 6 and the planar semiconductor layer 10 may be removed from the through-memory-level via region 500. The opening in the optional planar material layer 6 and the planar semiconductor layer 10 within the area of the through-memory-level via region 500 can be filled with a dielectric material (such as undoped silicate glass (e.g., silicon oxide) or doped silicate glass), which can be added to, and incorporated into, the at least one lower-interconnect-level dielectric material layer (160, 170, 180, 190).

The optional planar material layer 6 includes a conductive material such as a metal or a heavily doped semiconductor material. The optional planar material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar material layer 6. The optional planar material layer 6 may function as a special source line in the completed device. Alternatively, the optional planar material layer 6 may comprise an etch stop layer and may comprise any suitable conductive, semiconductor or insulating layer.

The optional planar semiconductor layer 10 can be formed over the at least one lower-interconnect-level dielectric material layer (160, 170, 180, 190) and above the level of the peripheral devices. The planar semiconductor layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor layer 10 can be formed directly above a subset of the semiconductor devices on the substrate semiconductor layer 9 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate semiconductor layer 9). In one embodiment, the planar semiconductor layer 10 or portions thereof can be doped with electrical dopants, which may be p-type dopants or n-type dopants. The conductivity type of the dopants in the planar semiconductor layer 10 is herein referred to as a first conductivity type.

An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

Figure 3:
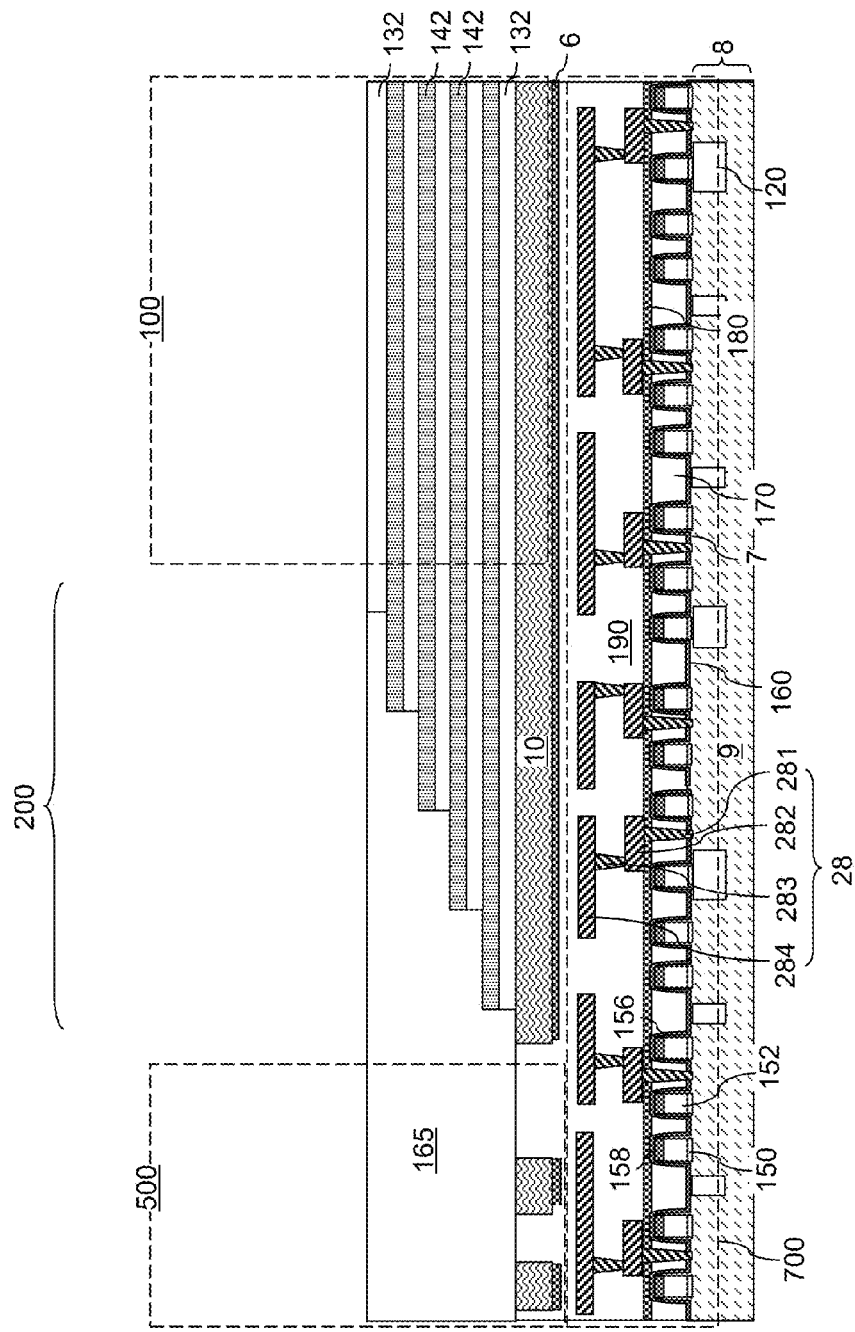
FIG. 3 is a vertical cross-sectional view of the exemplary structure after formation of a first retro-stepped dielectric material portion according to an embodiment of the present disclosure.

Referring to FIG. 3, the first-tier alternating stack (132, 142) can be patterned to form a first retro-stepped cavity along an interface between the word line contact via region 200 and the through-memory-level via region 500. The first stepped surfaces can be formed, for example, by forming a mask (which may be a patterned photoresist layer or a patterned hard mask layer) with an opening therein, etching a cavity within the level of the topmost first insulating layer 132, and iteratively expanding the etched area and vertically recessing the cavity by etching each pair of a first sacrificial material layer 142 and a first insulating layer 132 located directly underneath the bottom surface of the etched cavity within the etched area. First stepped terraces are formed between the through-memory-level via region 500 and each word line contact via region 200 through the first-tier alternating stack (132, 142). The region of the first stepped terraces is herein referred to as a first terrace region. The first stepped terraces of the first-tier alternating stack (132, 142) can be located in a portion of the word line contact via region 200 that adjoins the through-memory-level via region 500. The first stepped terraces of the first-tier alternating stack (132, 142) define a boundary of the first retro-stepped cavity.

The masking layer can be removed, for example, by ashing. A dielectric material can be deposited to fill the first stepped cavity to form a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first tier structure, which is an in-process structure that is subsequently modified.

Figure 4A:
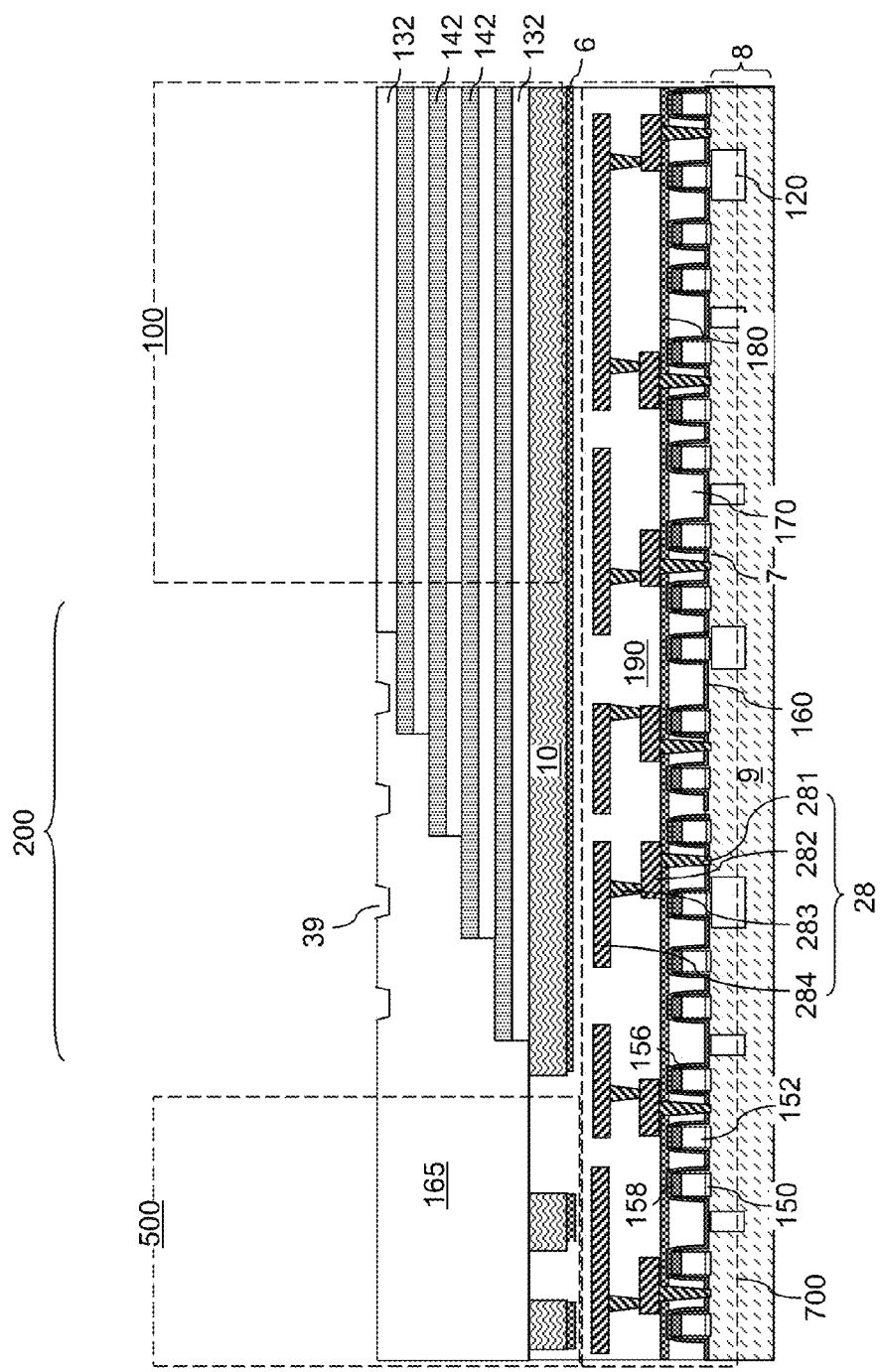
FIG. 4A is a vertical cross-sectional view of the exemplary structure after formation of discrete recesses according to an embodiment of the present disclosure.
Figure 4B:
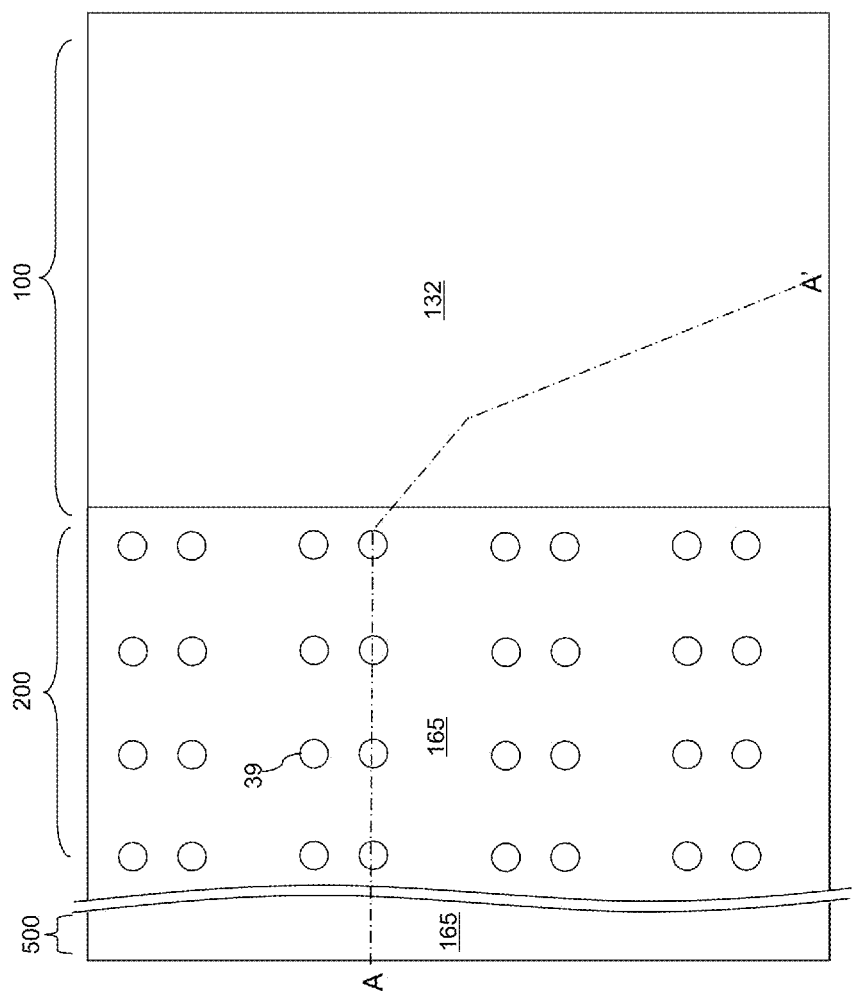
FIG. 4B is a top-down view of the exemplary structure of FIG. 4A.

Referring to FIGS. 4A and 4B, a first photoresist layer (not shown) can be applied over the first tier structure (132, 142, 165), and can be lithographically patterned to form openings (e.g., recesses) in the word line contact via region 200. The areas of the openings in the second photoresist layer are selected to coincide with the areas of contact via structures to be subsequently formed to provide electrical contact to first electrically conductive layers, which are formed by replacement of the sacrificial material of the first sacrificial material layers 142 with a conductive material (such as a metallic material). Thus, each area of the openings in the second photoresist layer can be within the area of a respective one of the horizontal surfaces of the first stepped terrace in the word line contact via region 200.

An etch is performed employing the first photoresist layer as an etch mask. The etch process can be an anisotropic etch process such as a reactive ion etch process, or can be an isotropic etch process such as a wet etch process, or a combination of an isotropic etch process and an anisotropic etch process. The chemistry of the etch process is selected such that the etchant etches the material of the first retro-stepped dielectric material portion 165. For example, if the first retro-stepped dielectric material portion 165 includes silicon oxide, the etch process can be a wet etch process employing dilute hydrofluoric acid. Discrete recesses 39 are formed on the top surface of the first retro-stepped dielectric material portion 165. The surface of the first retro-stepped dielectric material portion is vertically recessed at each discrete recess 39. The duration of the etch process is selected such that the depth of the discrete recesses 39 is less than the thickness of the topmost insulating layer 132. For example, if the thickness of the topmost insulating layer 132 is in a range from 20 nm to 100 nm, the depth of the discrete recesses 39 can be in a range from 10 nm to 50 nm, although lesser and greater depths can also be employed. Each area of the discrete recesses 39 can be within the area of a respective one of the horizontal surfaces of the first stepped terrace in the word line contact via region 200. The first photoresist layer can be removed, for example, by ashing.

Figure 5:
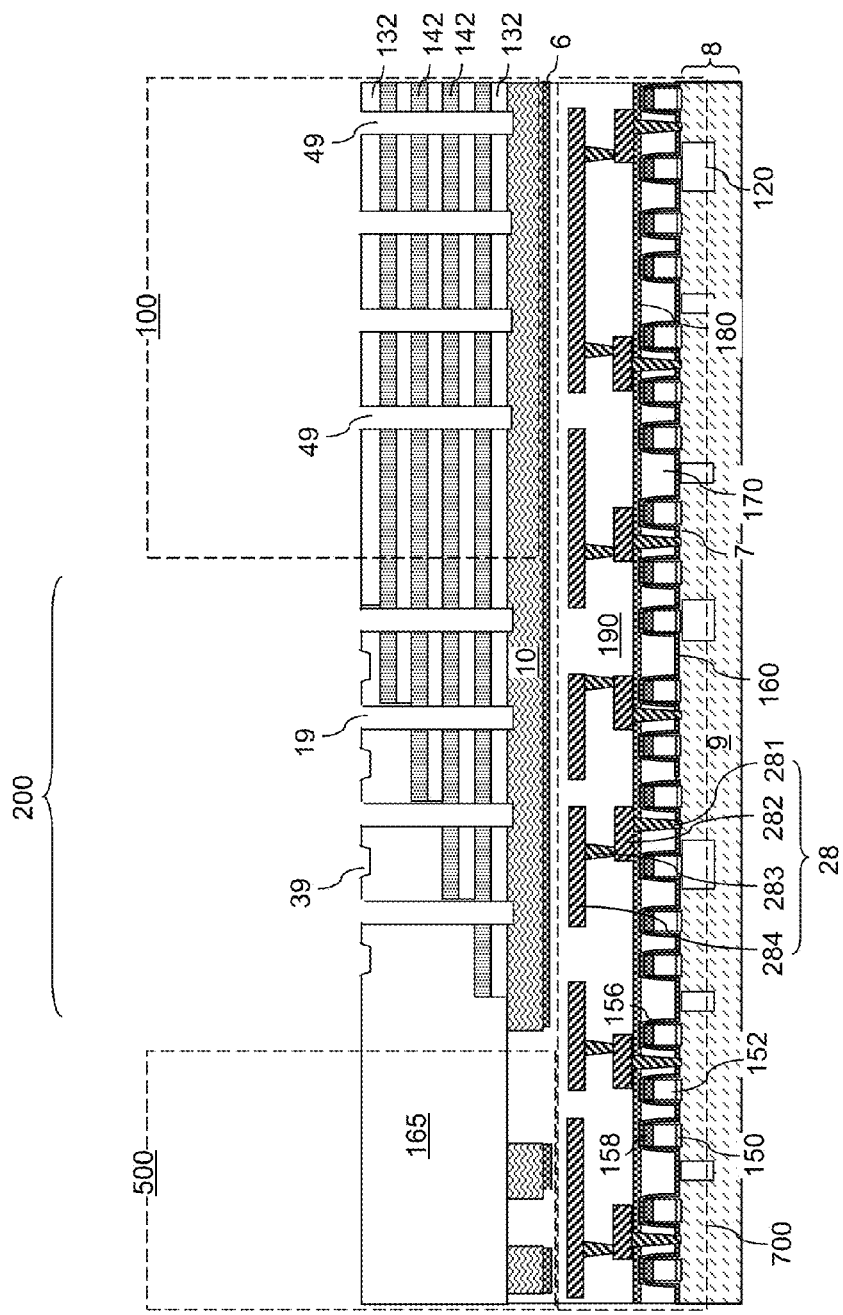
FIG. 5 is a vertical cross-sectional view of the exemplary structure after formation of first memory openings and first peripheral via cavities according to an embodiment of the present disclosure.

Referring to FIG. 5, first memory openings 49 and optional support openings 19 can be formed in the memory array region 100 and the word line contact via region 200, respectively. The first memory openings 49 and the optional support openings 19 can be formed by applying and patterning a second photoresist layer (not shown) over the first tier structure (132, 142, 165), and transferring the pattern of openings in the second photoresist layer through the first tier structure (132, 142, 165) and into underlying material portions employing an anisotropic etch process. The first memory openings 49 are formed in the memory array region 100 areas in which memory stack structures are subsequently formed to provide a three-dimensional array of memory elements. The support openings 19 are formed in the word line contact via region 200. The support openings 19 are formed at locations at which dummy memory stack structures are subsequently formed. The dummy memory stack structures are not electrically connected, and are employed to provide structural support during replacement of the first sacrificial material layers 142 with first electrically conductive layers in a subsequent processing step.

The locations of the support openings 19 can be selected such that the areas of the support openings 19 do not overlap with areas of the discrete recesses 39. The chemistry of the anisotropic etch process can be selected such that the etch rate depends on the accessibility of the reactive ions to the bottom of cavities that are formed through the first tier structure (132, 142, 165). The first memory openings 49 are formed through the first-tier alternating stack (132, 142) in the memory array region 100, and may be formed as two-dimensional periodic arrays. In one embodiment, each of the support openings 19 can be formed through the first-tier alternating stack (132, 142) and the first retro-stepped dielectric material portion 165 in the word line contact via region 200. The first memory openings 49 and the support openings 19 can be formed through the first-tier alternating stack (132, 142) concurrently (i.e., in the same lithography and etching steps). The second photoresist layer can be subsequently removed, for example, by ashing.

Figure 6:
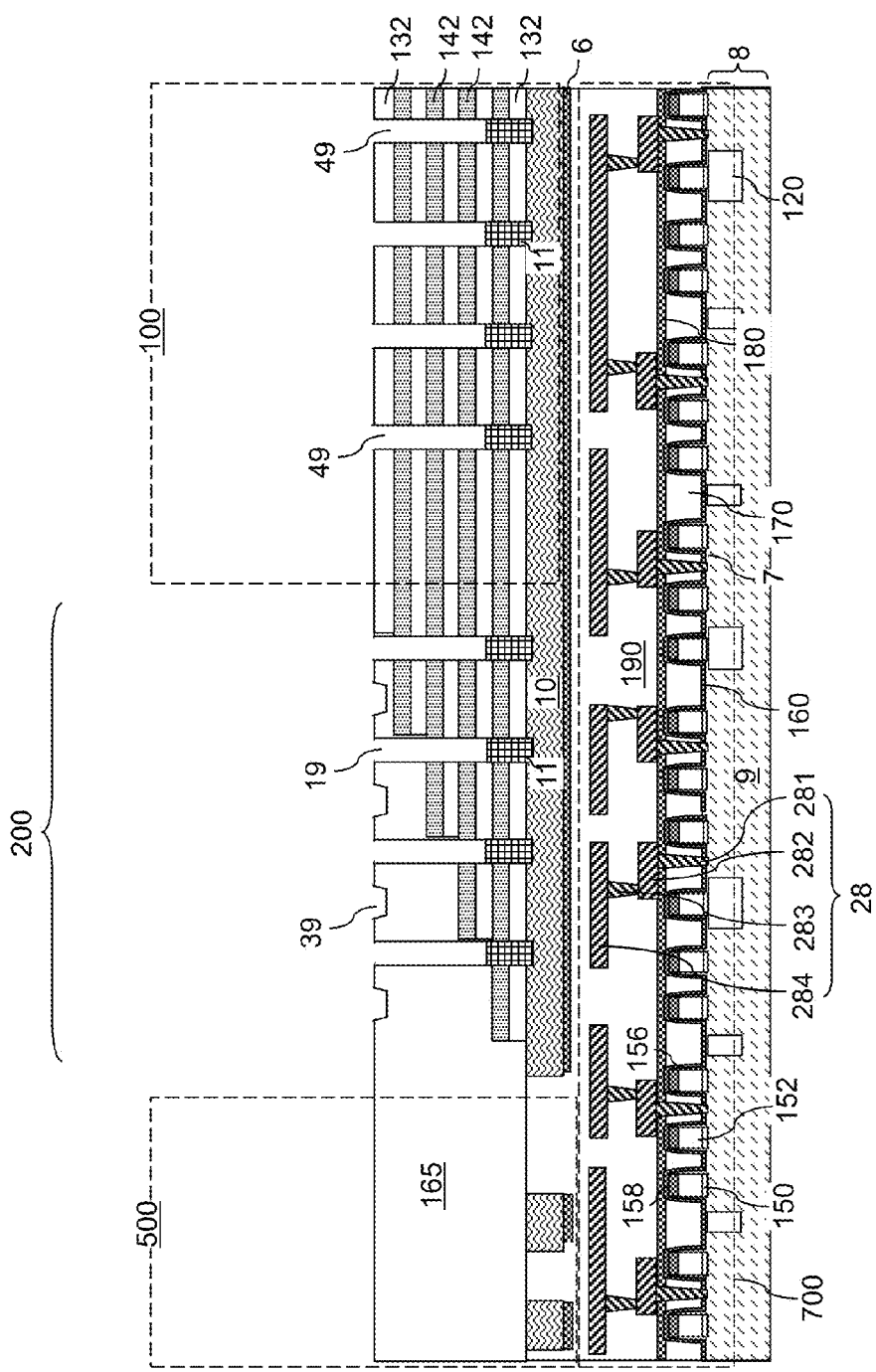
FIG. 6 is a vertical cross-sectional view of the exemplary structure after formation of semiconductor pedestals according to an embodiment of the present disclosure.

Referring to FIG. 6, semiconductor pedestals 11 can be formed by selective deposition of a doped semiconductor material directly on the top surfaces of the planar semiconductor layer 10. During the selective deposition process, at least one reactant for depositing the doped semiconductor material and at least one etchant for etching the doped semiconductor material are flowed into a process chamber simultaneously or alternately. The doped semiconductor material has a higher deposition rate on semiconductor surfaces than on dielectric surfaces. By selecting process conditions such that the etch rate by the etchant is greater than the deposition rate of the doped semiconductor material on dielectric surfaces and less than the deposition rate of the doped semiconductor material on semiconductor surfaces, the doped semiconductor material can grow only from semiconductor surfaces such as the top surfaces of the planar semiconductor layer 10. The top surface of each semiconductor pedestal 11 can be at the level of a first insulating layer 132.

Figure 7:
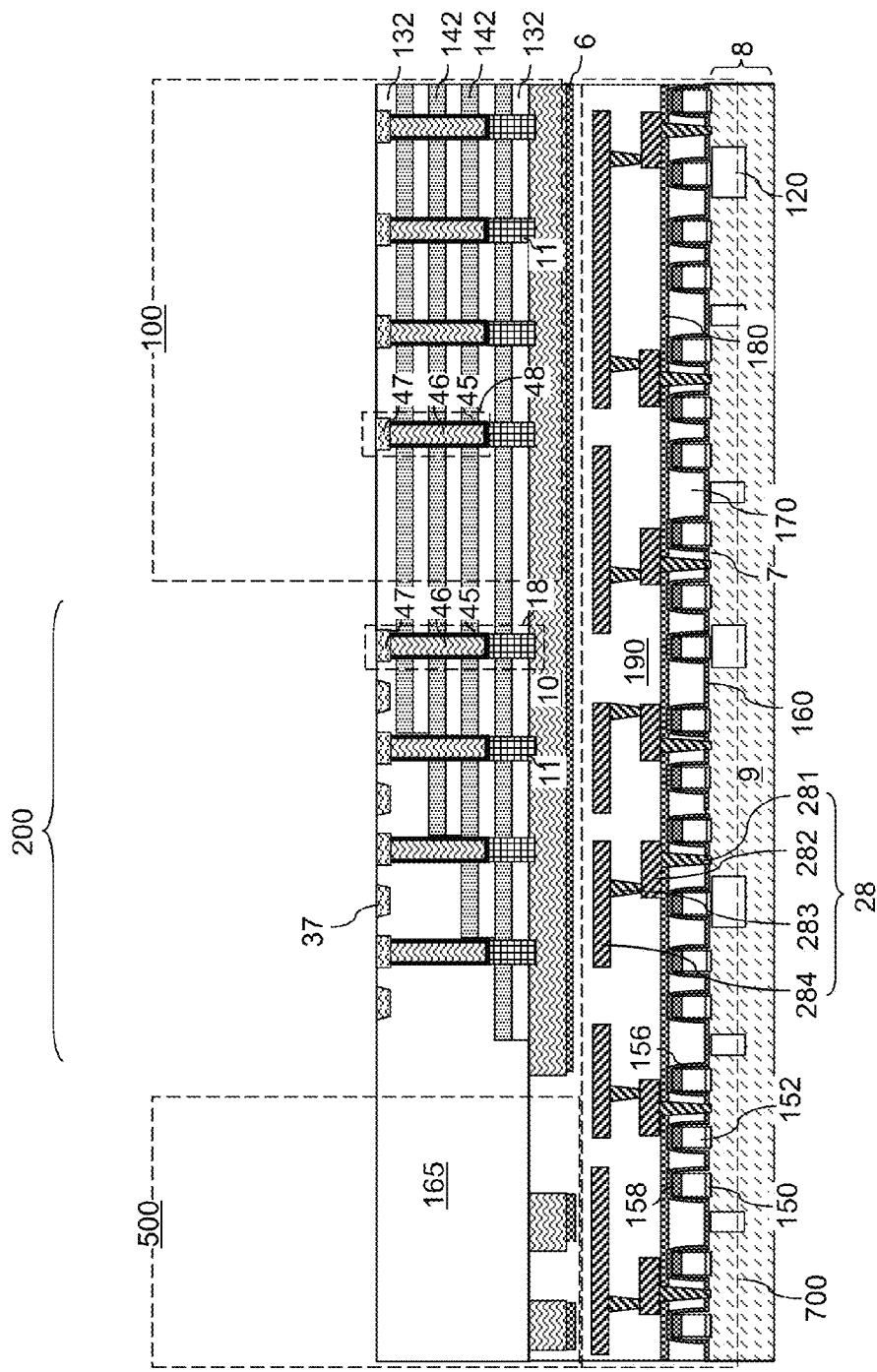
FIG. 7 is a vertical cross-sectional view of the exemplary structure after formation of first memory opening fill structures and support pillar structures according to an embodiment of the present disclosure.

Referring to FIG. 7, an optional sacrificial liner 45 can be formed in the first memory openings 49 and in the support openings 19. The sacrificial liner 45 can include a dielectric material such as silicon oxide. The sacrificial liner 45 can be formed by deposition of a sacrificial dielectric material, and/or can be formed by thermal or plasma conversion of physically exposed semiconductor surfaces such as the top surfaces of the semiconductor pedestals 11 or the planar semiconductor layer 10 (in case the semiconductor pedestals 11 are not formed). The thickness of the sacrificial liner 45 can be in a range from 2 nm to 6 nm, although lesser and greater thicknesses can also be employed.

A first sacrificial fill material is deposited in the first memory openings 49 and the support openings 19 by a conformal or non-conformal deposition method. The sacrificial fill material is a material that can be removed selective to the sacrificial liner 45, or selective to the materials of the first-tier alternating stack (132, 142) and the planar semiconductor layer 10 in case the sacrificial liner 45 is not employed. In one embodiment, the sacrificial fill material can include a semiconductor material such as polysilicon, amorphous silicon, amorphous germanium, an amorphous silicon-germanium alloy. Alternatively, the sacrificial fill material can include a dielectric material such as borosilicate glass or organosilicate glass. Alternatively, the sacrificial fill material can include amorphous carbon, diamond-like carbon (DLC), or a silicon-containing polymer. Excess portions of the sacrificial material can be removed from above the first-tier structure (132, 142, 165), for example, by a recess etch and/or chemical mechanical planarization. First sacrificial fill material portions 46 are formed in the first memory openings 49 and in the support openings 19. The discrete recesses 39 can be temporarily filled with the first sacrificial fill material.

Optionally, the first sacrificial fill material portions 46 can be vertically recessed selective to the materials of the first insulating layers 132 by a recess etch process, which can be a dry etch process or a wet etch process. The sacrificial fill material within the discrete recesses 39 can be removed at this process step. The recess depth of the recess etch process can be less than the thickness of the topmost insulating layer 132 of the first alternating stack (132, 142).

An isotropic etch process can be performed to laterally expand the recessed portions of the first memory openings 49 and the support openings 19. Cavities having a greater lateral extent than the underlying first sacrificial fill material portions 46 are formed at an upper portion of the topmost first insulating layer 132. The discrete cavities 39 can be laterally expanded by the isotropic etch process. A second sacrificial fill material can be deposited within the cavities overlying the vertically recessed first sacrificial fill material portions 46 to form second sacrificial fill material portions 47. The second sacrificial fill material can also fill the discrete cavities 39 to form sacrificial etch stop portions 37. The second sacrificial fill material can be any of the materials that can be employed as the first sacrificial fill material. Excess portions of the second sacrificial fill material can be removed from above the top surfaces of the topmost first insulating layer 132 and the first retro-stepped dielectric material portion 165 by a planarization process such as chemical mechanical planarization.

Each contiguous combination of material portions filling a first memory opening 49 and excluding the semiconductor pedestals 11 constitutes a sacrificial memory opening fill structure 48. Each contiguous combination of material portions filling a support opening 49 constitutes a support pillar structure 18. Each of the sacrificial memory opening fill structures 49 can include an optional sacrificial liner 45, a first sacrificial fill material portion 46, and an optional second sacrificial fill material portion 47. Each of the support pillar structures 18 can include an optional semiconductor pedestal 11, an optional sacrificial liner 45, a first sacrificial fill material portion 46, and an optional second sacrificial fill material portion 47. Each of the discrete recesses 39 can be filled with a respective sacrificial etch stop portion 37, which can include the first sacrificial fill material or the second sacrificial fill material. The sacrificial etch stop portions 39 are formed within an upper portion of the first retro-stepped dielectric material portion 165.

Figure 8:
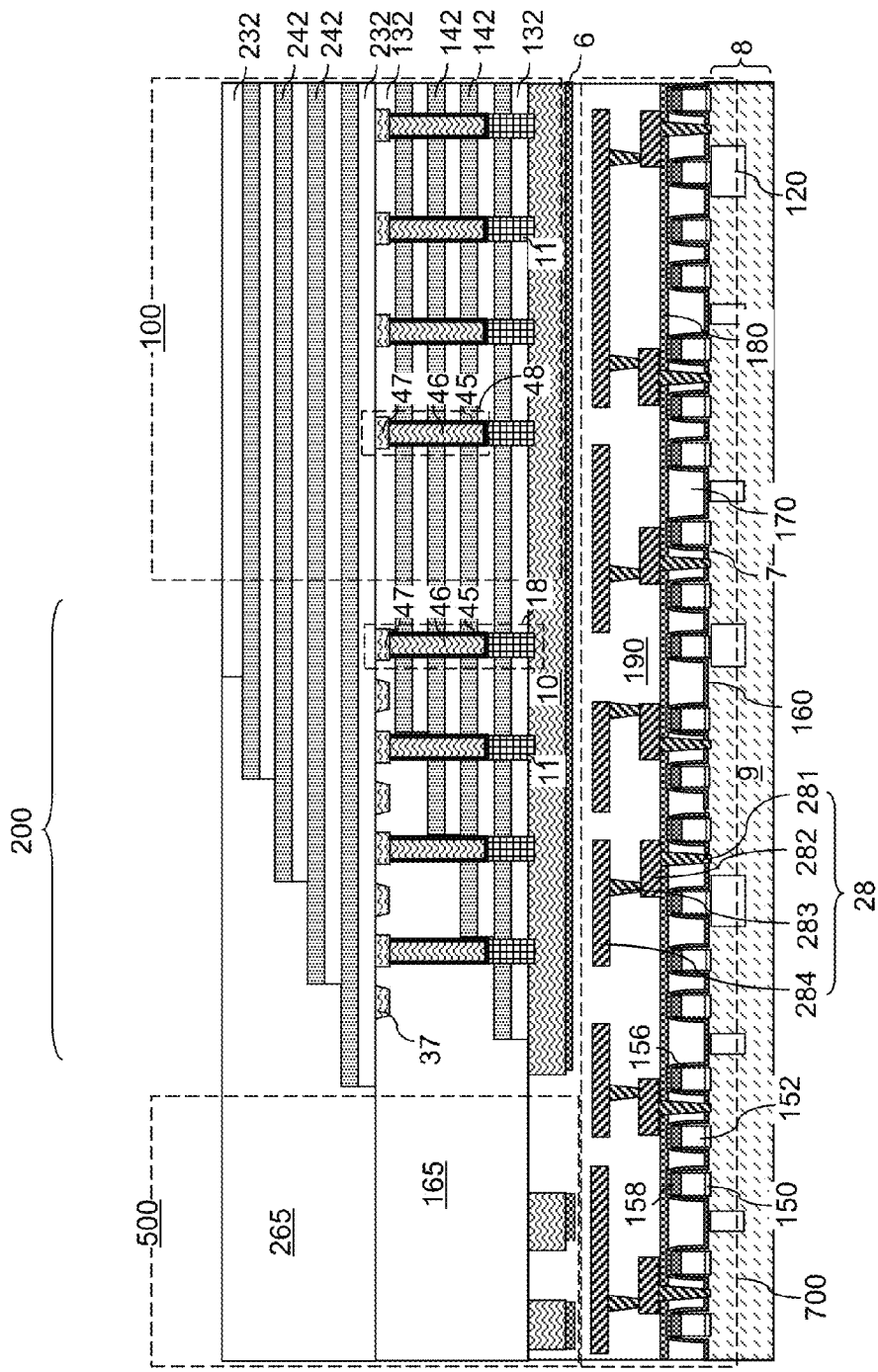
FIG. 8 is a vertical cross-sectional view of the exemplary structure after formation of a second tier structure, which includes patterned portions of an alternating stack of second insulating layers and second spacer material layers and a second retro-stepped dielectric material portion, according to an embodiment of the present disclosure.

Referring to FIG. 8, a second tier structure can be formed over the first tier structure (132, 142, 165). The second tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

The second-tier alternating stack (232, 242) can be patterned to form a second retro-stepped cavity along an interface between the word line contact via region 200 and the through-memory-level via region 500. The second stepped surfaces can be formed, for example, by forming a masking layer with an opening therein, etching a cavity within the level of the topmost second insulating layer 232, and iteratively expanding the etched area and vertically recessing the cavity by etching each pair of a second insulating layer 232 and a second sacrificial material layer 242 located directly underneath the bottom surface of the etched cavity within the etched area.

Second stepped terraces are formed over the first stepped surfaces and between the through-memory-level via region 500 and each word line contact via region 200 through the second-tier alternating stack (232, 242). The masking layer can be removed, for example, by ashing. A dielectric material can be deposited to fill the second stepped cavity to form a second-tier retro-stepped dielectric material portion 265. The second-tier alternating stack (232, 242) and the second-tier retro-stepped dielectric material portion 265 collectively constitute a second tier structure, which is an in-process structure that is subsequently modified. A second retro-stepped dielectric material portion 265 is located in the second tier structure (232, 242, 265) and overlies, and contacts, second stepped terraces of the second alternating stack (232, 242). The second stepped terraces (i.e., steps or staircase) of the second alternating stack (232, 242) overly (e.g., have an areal overlap with) the first stepped terraces of the first alternating stack (132, 242) in direction perpendicular to the top surface of the substrate 8.

Figure 9A:
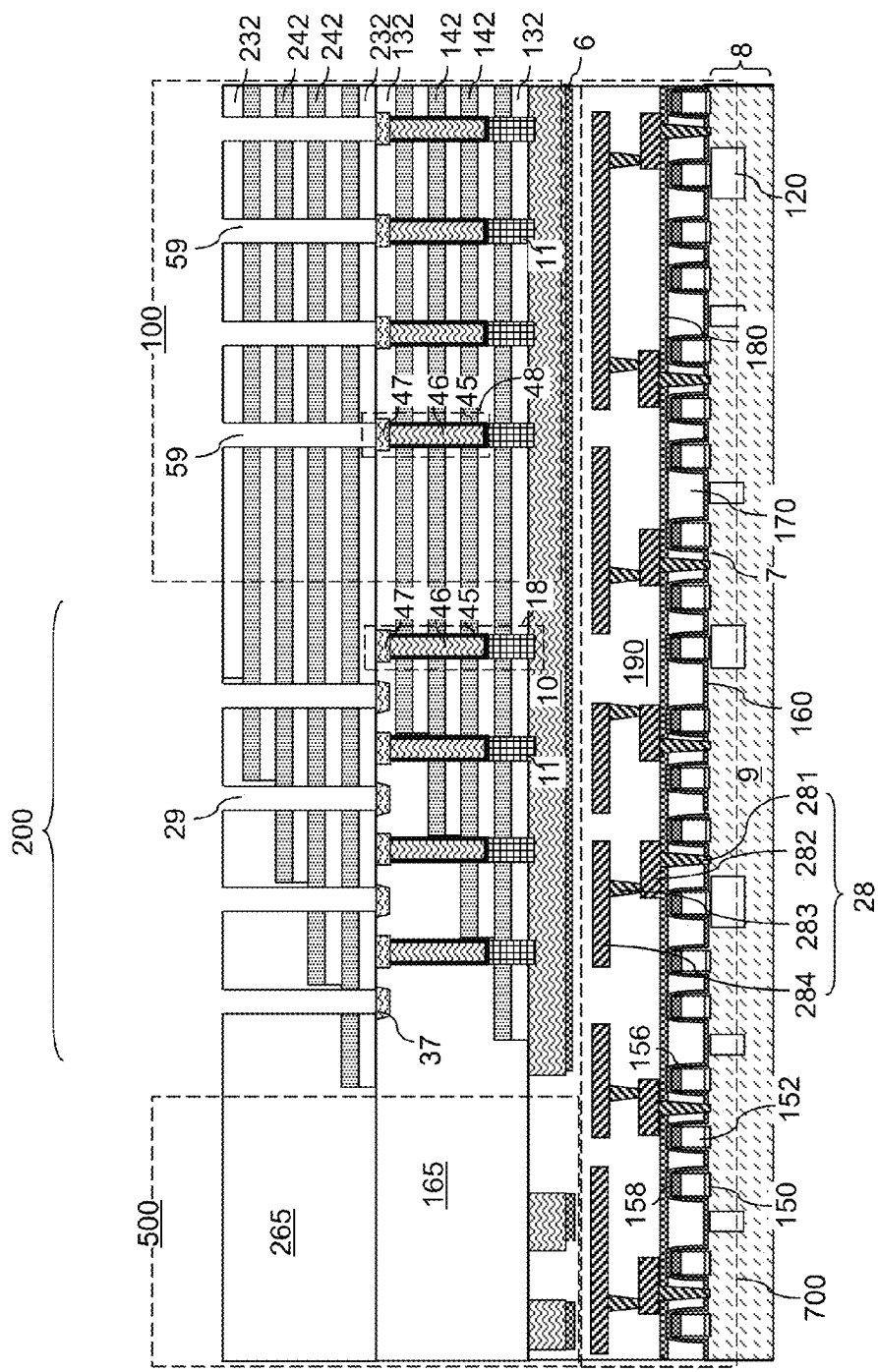
FIG. 9A is a vertical cross-sectional view of the exemplary structure after formation of second memory openings and second-tier via cavities according to an embodiment of the present disclosure.

Referring to FIGS. 9A and 9B, second memory openings 59 and second-tier via cavities 29 can be formed in the memory array region 100 and the word line contact via region 200, respectively. The second memory openings 59 and the second-tier via cavities 29 can be formed by applying and patterning a photoresist layer (not shown) over the second tier structure (232, 242, 265), and transferring the pattern of openings in the photoresist layer through the second tier structure (232, 242, 265) employing an anisotropic etch process. The sacrificial etch stop portions 37 can be employed as etch stop structures. Thus, the second-tier via cavities 29 do not extend through the support cavities or through the first alternating stack (132, 242).

The locations of the second memory openings 59 are selected such that each area of the second memory openings 59 overlaps with the area of a respective underlying sacrificial memory opening fill structure 48. A top surface of an underlying sacrificial memory opening fill structure 48 (which can be the top surface of the respective second sacrificial fill material portion 47 if the second sacrificial fill material portions 47 are employed) can be physically exposed underneath each second memory opening 59. The locations of second-tier via cavities 29 are selected such that each area of the second-tier via cavities 29 overlaps with the area of a respective sacrificial etch stop portion 37. A top surface of an underlying sacrificial etch stop portion 37 can be physically exposed underneath each second-tier via cavity 29. The areas of the second-tier via cavities 29 do not overlap with the areas of the support pillar structures 18.

The second-tier contact openings 29 are formed in the second terrace region through the second tier structure (232, 242, 265), i.e., through the second retro-stepped dielectric material portion 265 and through the second alternating stack (232, 242). The second memory openings 59 are formed within the memory array region 100 concurrently with formation of the second-tier contact openings 29. Top surfaces of the sacrificial memory opening fill structures 48 are physically exposed underneath the second memory openings 59. The photoresist layer can be removed, for example, by ashing.

Figure 10:
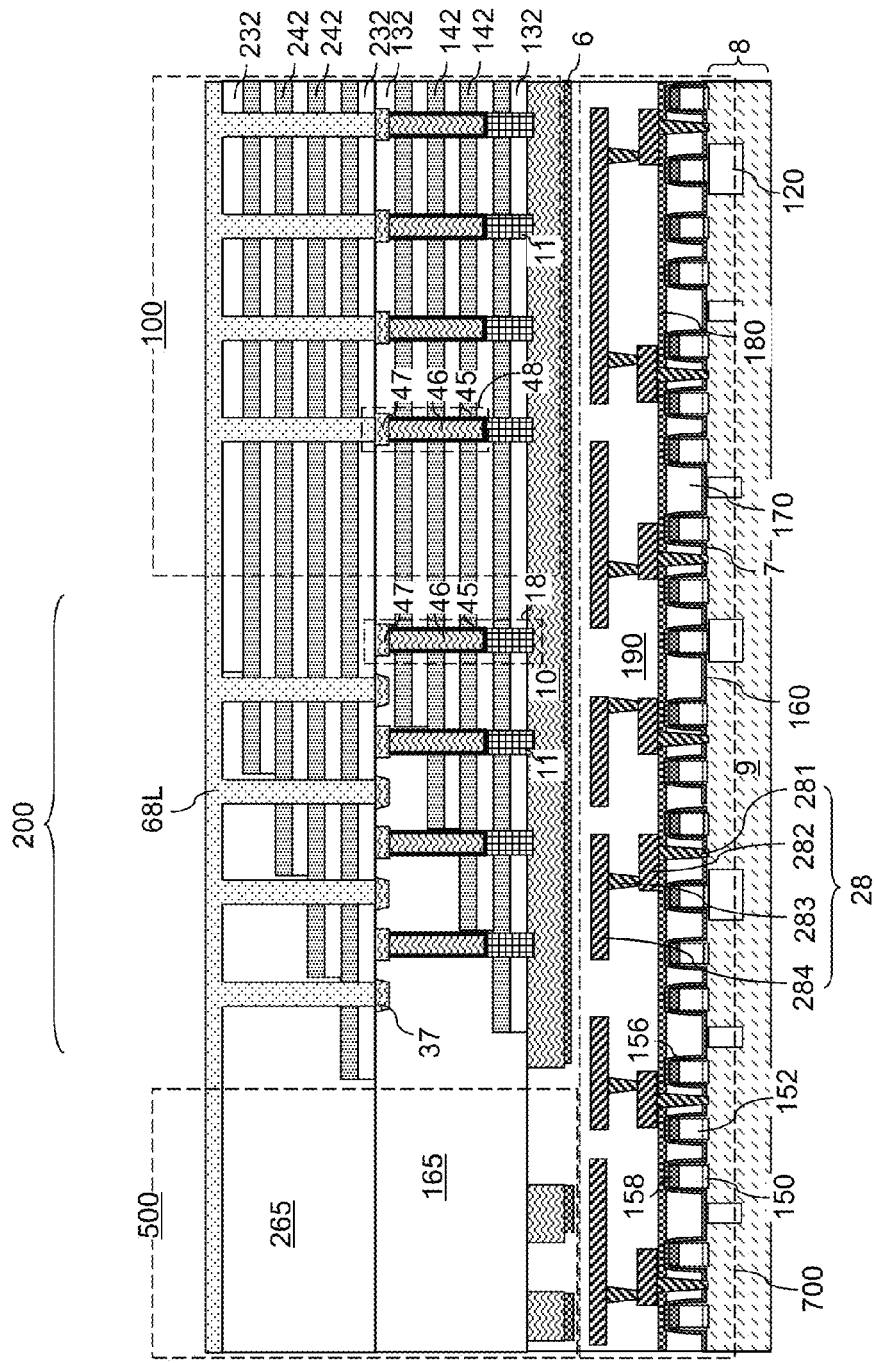
FIG. 10 is a vertical cross-sectional view of the exemplary structure after formation of a sacrificial memory opening fill material layer according to an embodiment of the present disclosure.

Referring to FIG. 10, a sacrificial memory opening fill material layer 68L can be deposited in the second-tier contact openings 29 and the second memory openings 59. The sacrificial memory opening fill material layer 68L includes a sacrificial fill material that can be removed selective to the materials of the second alternating stack (232, 242) and the second retro-stepped dielectric material portion 265. For example, the sacrificial memory opening fill material layer 68L can include a material selected from a semiconductor material (such as polysilicon, amorphous silicon, amorphous germanium, an amorphous silicon-germanium alloy), a dielectric material (such as borosilicate glass or organosilicate glass), amorphous carbon, diamond-like carbon (DLC), or a silicon-containing polymer. In one embodiment, the sacrificial memory opening fill material layer 68L can include amorphous silicon.

Figure 11:
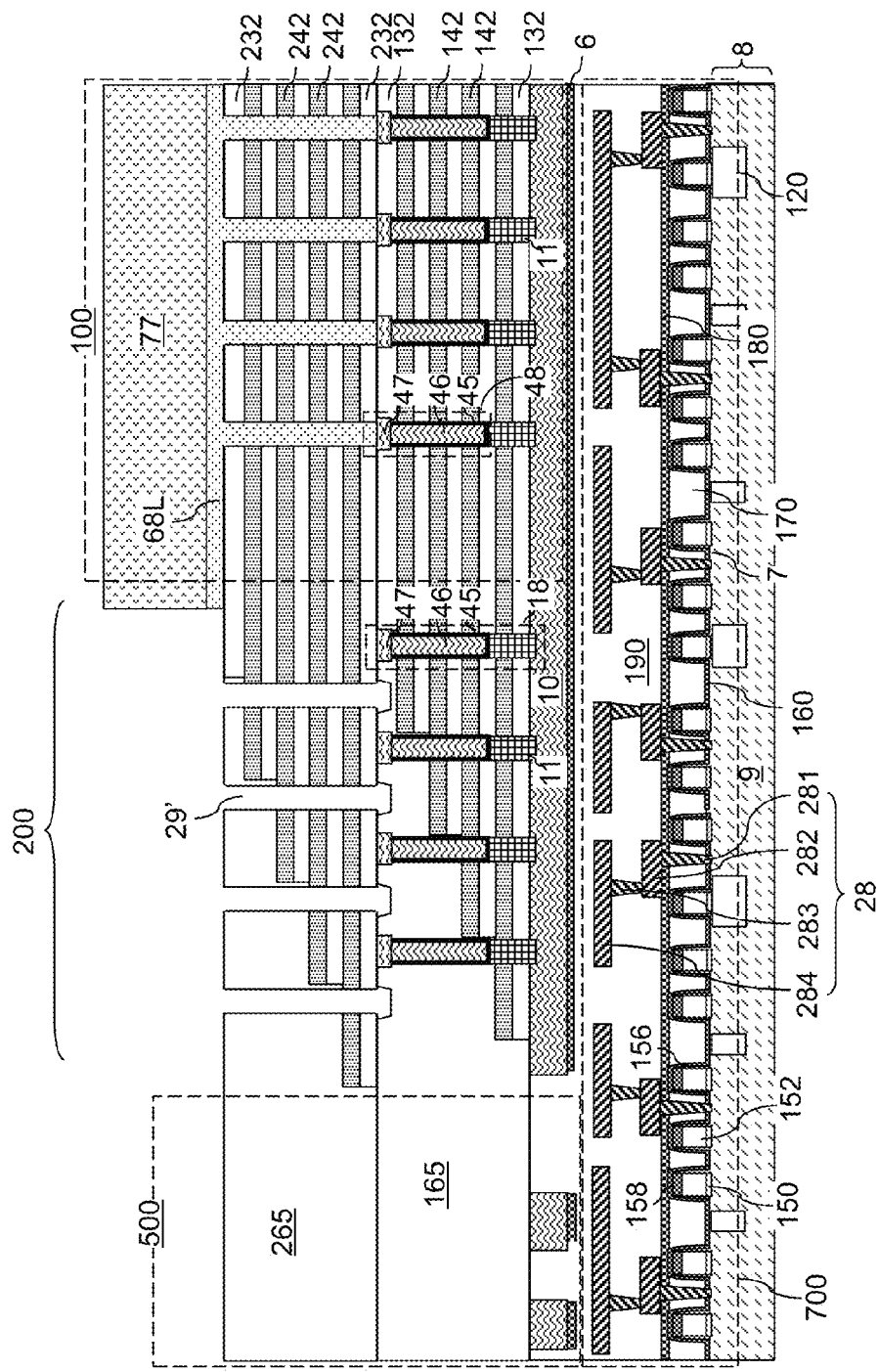
FIG. 11 is a vertical cross-sectional view of the exemplary structure after patterning of the sacrificial memory opening fill material layer according to an embodiment of the present disclosure.

Referring to FIG. 11, a photoresist layer 77 can be applied over the sacrificial memory opening fill material layer 68L and lithographically patterned to cover the memory array region 100, while physically exposing the portions of the sacrificial memory opening fill material layer 68L in the word line contact via region 200 and the through-memory-level via region 500. An etch process can be performed to remove the portions of the sacrificial memory opening fill material layer 68L from the word line contact via region 200 and the through-memory-level via region 500. Thus, the sacrificial memory opening fill material layer 68L is removed from the volumes of the second-tier contact openings 29 to form cavities. Further, the volume of each cavity can be expanded by subsequently removing the sacrificial etch stop portions 37 selective to the second alternating stack (232, 242) and the retro-stepped dielectric material portions (165, 265). The cavities as extended by removal of the sacrificial etch stop portions 37 are herein referred to as extended via cavities 29'. Each extended cavity 29' includes a respective second-tier contact opening 29 and the underlying recess 39. Each extended cavity 29' vertically extends through the entirety of the second tier structure (232, 242, 265) and into an upper portion of the first retro-stepped dielectric material portion 165. The photoresist layer 77 can be subsequently removed, for example, by ashing.

Figure 12:
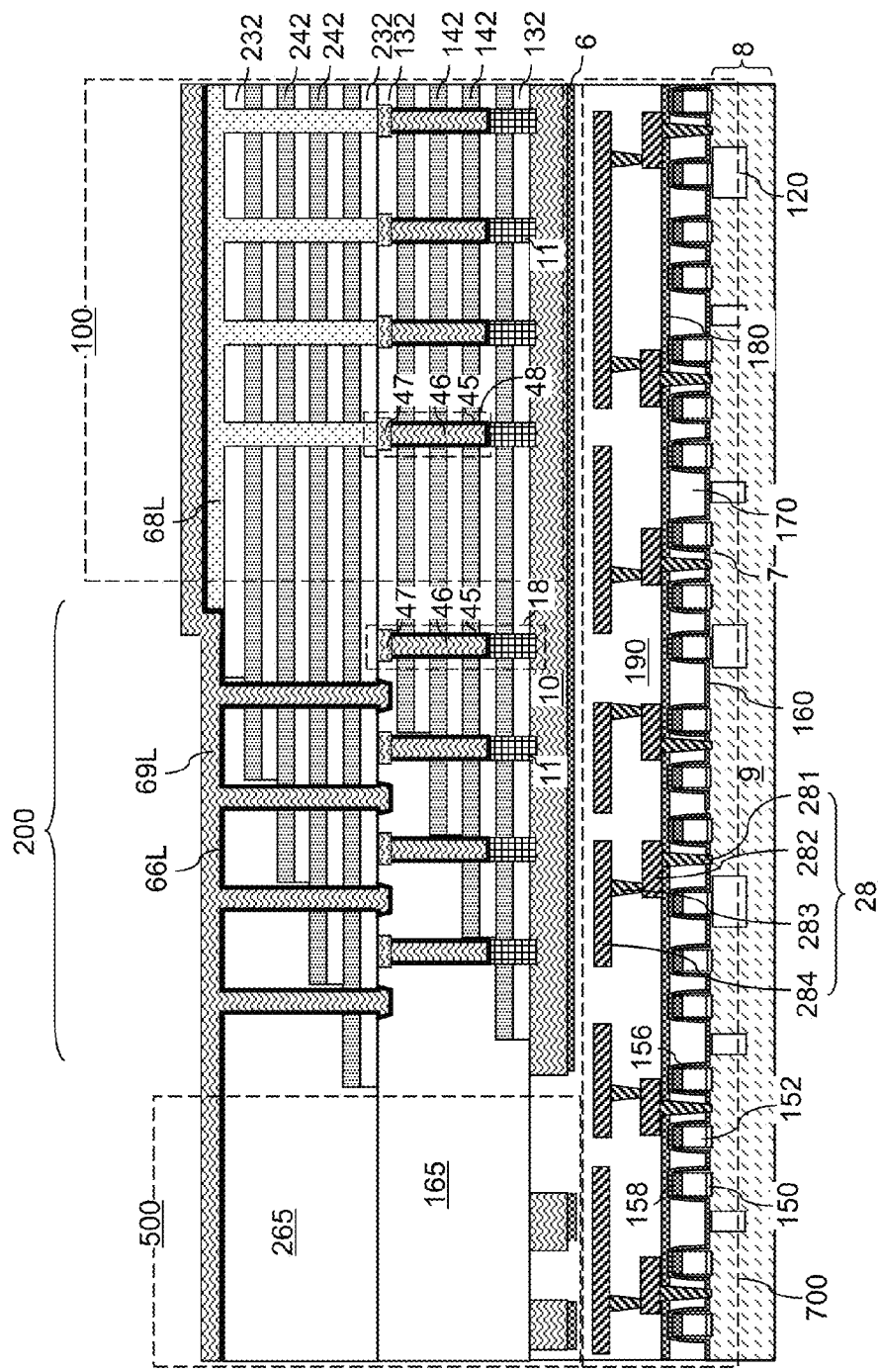
FIG. 12 is a vertical cross-sectional view of the exemplary structure after formation of a insulating liner layer and a sacrificial contact opening fill material layer according to an embodiment of the present disclosure.

Referring to FIG. 12, a insulating liner layer 66L and a sacrificial contact opening fill material layer 69L can be sequentially deposited. The insulating liner layer 66L includes a dielectric material that is different from the material of the second sacrificial material layers 242. For example, if the first and second insulating layers (132, 232) include silicon oxide and if the first and second sacrificial material layers (142, 242) include silicon nitride, the insulating liner layer 66L can include silicon oxide and/or a dielectric metal oxide. The insulating liner layer 66L can be deposited by a conformal deposition process such as chemical vapor deposition or atomic layer deposition. The thickness of the insulating liner layer 66L can be in a range from 2 nm to 30 nm, although lesser and greater thicknesses can also be employed.

The sacrificial contact opening fill material layer 69L includes a material that can be removed selective to the material of the insulating liner layer 66L. The sacrificial material of the sacrificial contact opening fill material layer 69L can be selected from a semiconductor material (such as polysilicon, amorphous silicon, amorphous germanium, an amorphous silicon-germanium alloy), a dielectric material (such as borosilicate glass or organosilicate glass), amorphous carbon, diamond-like carbon (DLC), or a silicon-containing polymer. In one embodiment, the sacrificial contact opening fill material layer 69L can include amorphous silicon.

Figure 13:
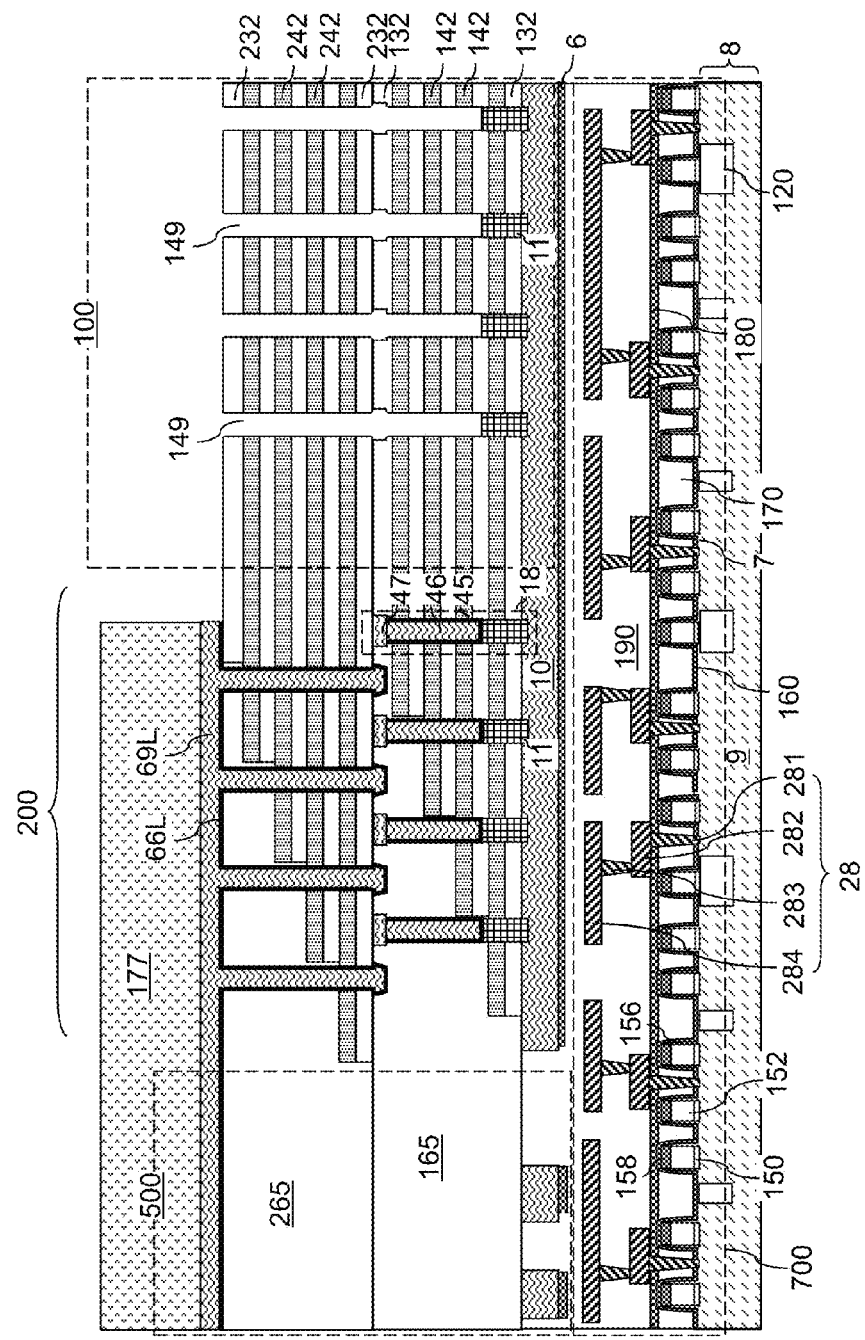
FIG. 13 is a vertical cross-sectional view of the exemplary structure after formation of inter-tier memory openings according to an embodiment of the present disclosure.
Figure 14:
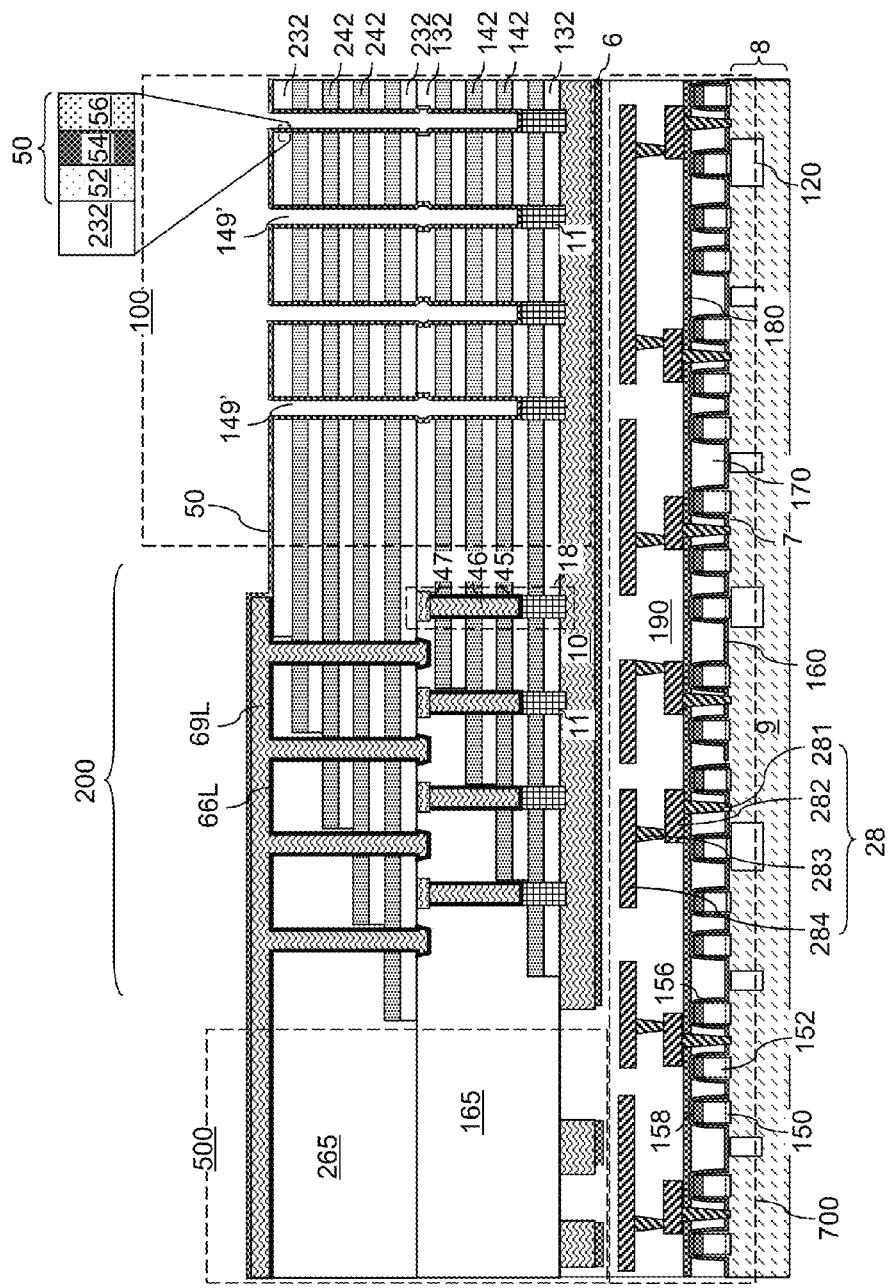
FIG. 14 is a vertical cross-sectional view of the exemplary structure after deposition of a memory film in the inter-tier memory openings according to an embodiment of the present disclosure.

Referring to FIG. 13, a photoresist layer 177 can be applied over the sacrificial contact opening fill material layer 69L and lithographically patterned to cover the word line contact via region 200 and the through-memory-level via region 500, while physically exposing the portions of the sacrificial contact opening fill material layer 69L in the memory array region 100. The exposed portions of the sacrificial contact opening fill material layer 69L, the insulating liner layer 66L, and the sacrificial memory opening fill material layer 68L within the area of the memory array region 100, i.e., within the area that is not covered by the patterned photoresist layer 177 are removed by selective etching. Subsequently, the second sacrificial fill material portions 47, the first sacrificial fill material portions 46, and the sacrificial liners 45 within the memory array region 100 can be removed to form inter-tier memory openings 149 that extend through the second alternating stack (232, 242) and a predominant portion of the first alternating stack (132, 142). As used herein, a predominant portion of an element refers to a portion that is more than 50% of the entire volume of the element.

In one embodiment, the sacrificial contact opening fill material layer 69L, the sacrificial memory opening fill material layer 68L, the second sacrificial fill material portions 47, and the first sacrificial fill material portions 46 can include amorphous silicon or polysilicon, and the insulating liner layer 46L and the sacrificial liners 45 can include silicon oxide. In this case, the amorphous silicon or the polysilicon of the various layers and material portions (69L, 68L, 47, 46) may be removed by a respective dry etch (such as a reactive ion etch employing $Cl_2$, HBr, and $O_2$) or a respective wet etch (such as a wet etch employing a KOH solution), and the silicon oxide material can be removed by a dry etch employing $CF_4$ or HF vapor or by a wet etch employing an HF solution. The photoresist layer 177 can be subsequently removed, for example, by ashing. The inter-tier memory openings 149 are formed by removing portions of the sacrificial memory opening fill material layer 68L that fill the second memory openings 59 and by removing the sacrificial memory opening fill structures 48.

Figure 15:
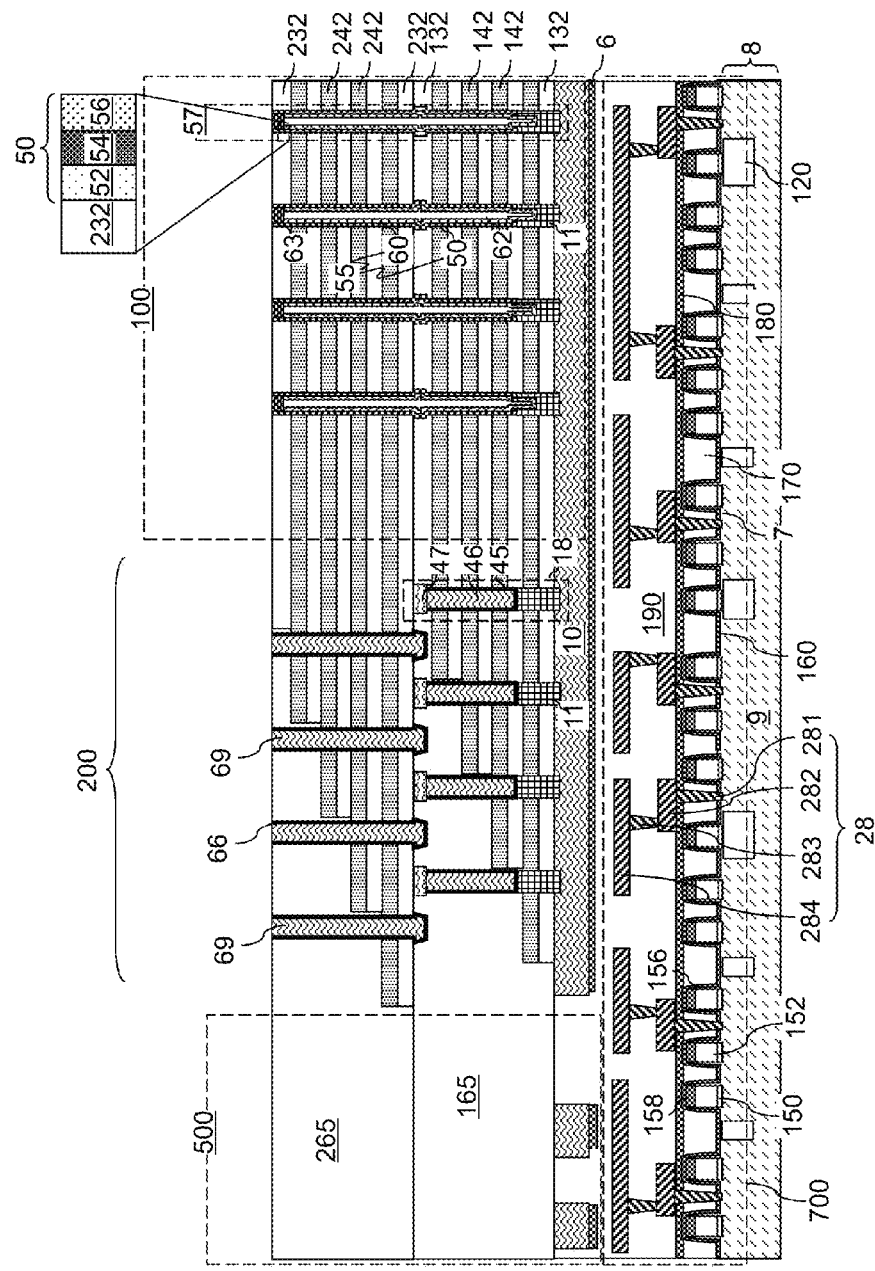
FIG. 15 is a vertical cross-sectional view of the exemplary structure after formation of memory stack structures, dielectric cores, and drain regions according to an embodiment of the present disclosure.

Referring to FIG. 15, a memory film 50 is deposited in the inter-tier memory openings 149 and over the second tier structure (232, 242, 265). The memory film 50 can include an optional blocking dielectric layer 52, a charge storage layer 54, and a tunneling dielectric layer 56.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

An optional cover material layer (not shown) can be deposited over the memory film 50. If employed, the cover material layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the cover material layer includes amorphous silicon or polysilicon. The cover material layer can be formed by a conformal deposition method such as low pressure chemical vapor deposition (LPCVD). The thickness of the cover material layer can be in a range from 2 nm to 10 nm, although lesser and greater thicknesses can also be employed. A memory cavity 149' is formed in the volume of each memory opening 49 that is not filled with the deposited material layers.

Referring to FIG. 15, an anisotropic etch process can be performed to remove horizontal portions of the cover material layer and the memory film 50. The cover material layer may be removed, or, in case the cover material layer includes a semiconductor material, vertical portions of the cover material layer can be subsequently incorporated into a respective semiconductor channel layer. Each remaining portion of the memory film 50 can be located within a respective inter-tier memory opening 149, and can have a cylindrical shape.

A semiconductor channel layer can be deposited directly on the semiconductor surface of the semiconductor pedestal 11 (or the planar semiconductor layer 10 if the semiconductor pedestal 11 is omitted) within each inter-tier memory opening 149. The semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer includes amorphous silicon or polysilicon. The semiconductor channel layer can be formed by a conformal deposition method such as low pressure chemical vapor deposition (LPCVD). The thickness of the semiconductor channel layer can be in a range from 2 nm to 10 nm, although lesser and greater thicknesses can also be employed. The semiconductor channel layer may partially fill the memory cavity 149' in each inter-tier memory opening 149, or may fully fill the memory cavity 149' in each inter-tier memory opening 149.

In case the memory cavity 149' in each inter-tier memory opening 149 is not completely filled by the semiconductor channel layer, a dielectric core layer can be deposited in the memory cavities 149' to fill any remaining portion of the memory cavities 149' within each inter-tier memory opening 149. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Portions of the dielectric core layer, the semiconductor channel layer, the sacrificial contact opening fill material layer 69L, and the insulating liner layer 66L can be removed by a planarization process from above the top surface of the topmost second insulating layer 232 and the top surface of the second retro-stepped dielectric material portion 265. Chemical mechanical planarization (CMP) and/or at least one recess etch process can be employed. Each remaining portion of the sacrificial contact opening fill material layer 69L constitutes a sacrificial via structure 69. Each remaining portion of the insulating liner layer 66L constitutes an insulating spacer 66. Each remaining portion of the semiconductor channel layer constitutes a vertical semiconductor channel 60. Each remaining portion of the dielectric core layer constitutes a dielectric core 62.

Subsequently, the dielectric cores 62 can be vertically recessed by a recess etch to form recessed regions. The bottom surfaces of the recessed regions can be at the level of the topmost second insulating layers 232. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within the inter-tier memory opening 149 constitutes a memory stack structure 55. The memory stack structure 55 is a combination of a vertical semiconductor channel 60, a tunneling dielectric layer, a plurality of memory elements as embodied as portions of the charge storage layer 54, and an optional blocking dielectric layer 52. Each combination of a semiconductor pedestal 11 (if present), a memory stack structure 55, a dielectric core 62, and a drain region 63 within a memory opening 49 is herein referred to as a memory opening fill structure 57.

Each memory stack structure 55 is formed through the first alternating stack (132, 142) and the second alternating stack (232, 242) in a memory array region 100 located adjacent to the first terrace region and the second terrace region. Each memory stack structure 55 comprises a vertical stack of memory elements located at levels of the first and second sacrificial material layers (142, 242). An insulating spacer 66 is formed at a periphery of each of the second-tier contact openings 29. A sacrificial via structure 69 is formed within each insulating spacer of each of the second-tier contact openings. The sacrificial via structures 69 are formed through the second retro-stepped dielectric material portion 265 and an upper portion of the first retro-stepped dielectric material portion 165.

Figure 16A:
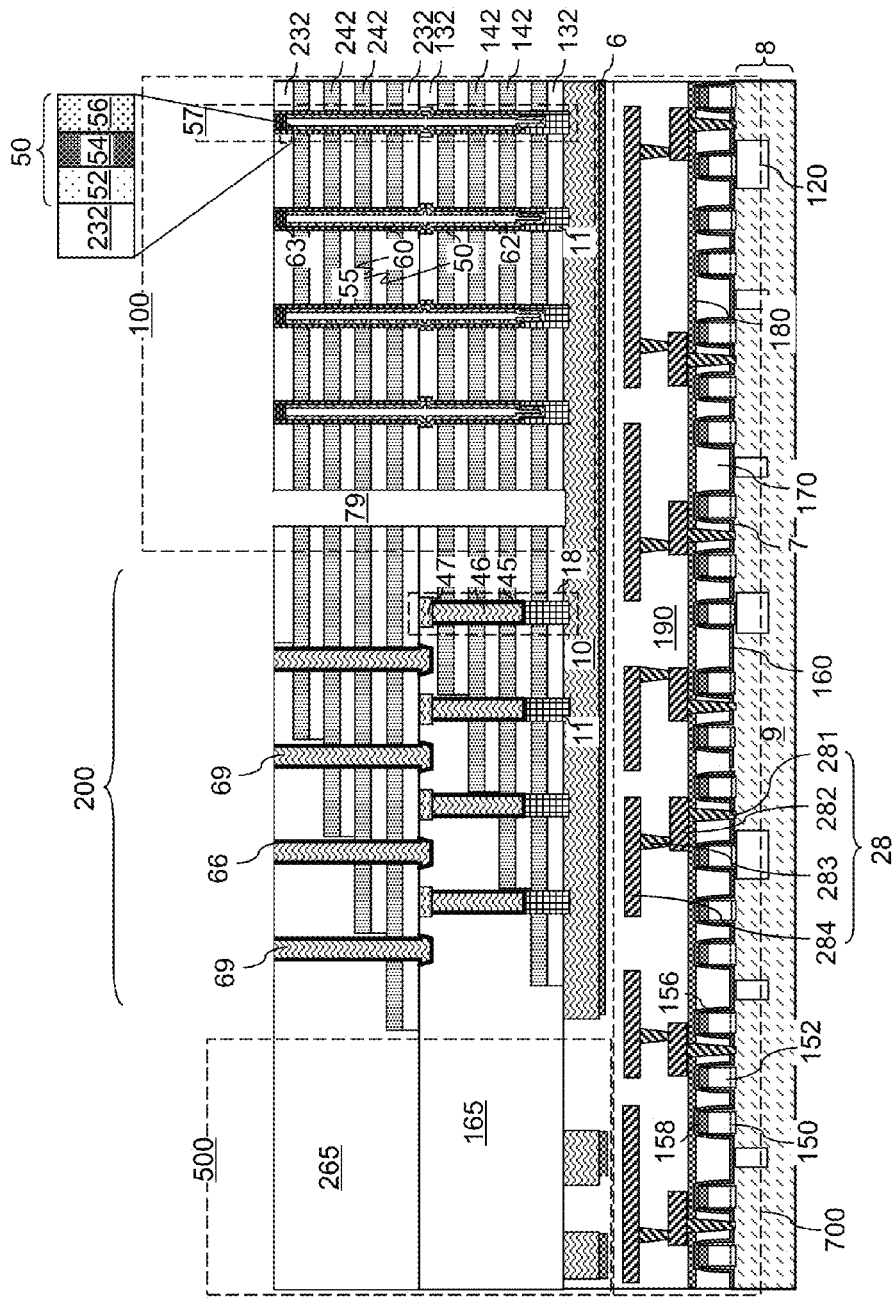
FIG. 16A is a vertical cross-sectional view of the exemplary structure after formation of backside trenches according to an embodiment of the present disclosure.
Figure 16B:
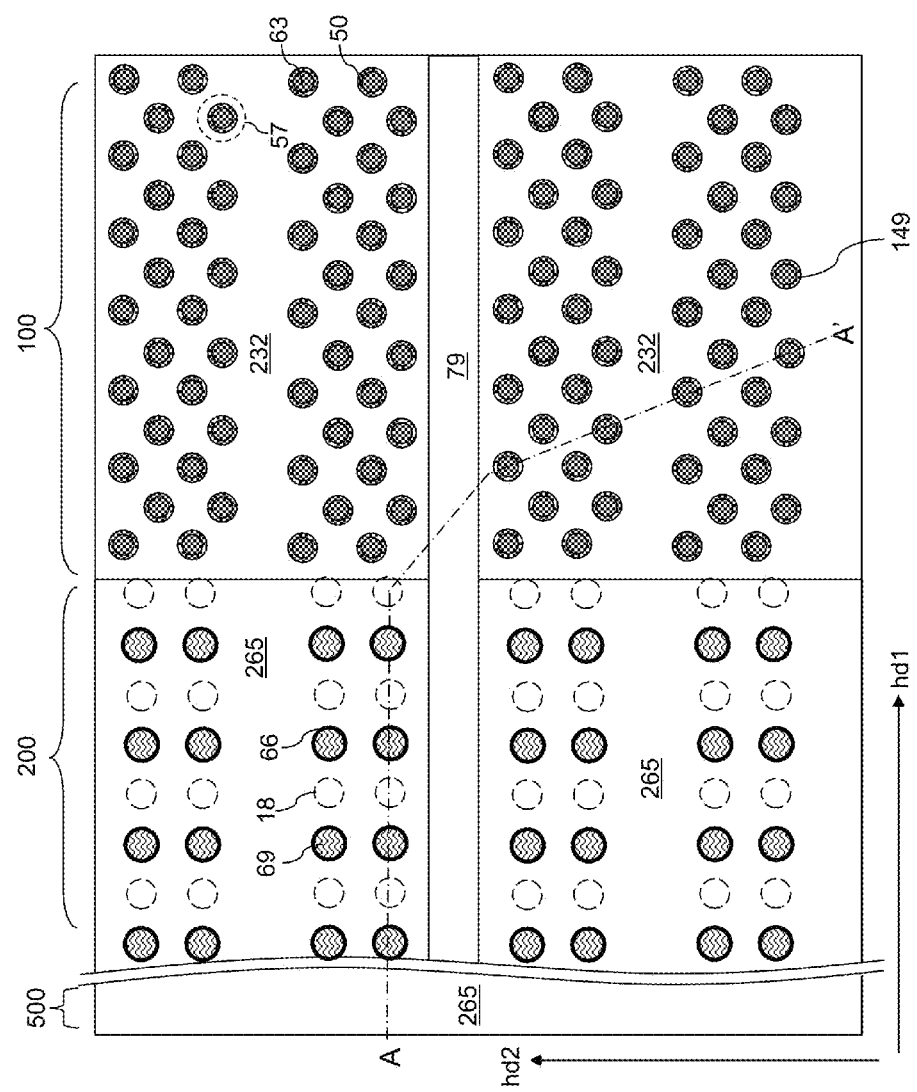
FIG. 16B is a top-down view of the exemplary structure of FIG. 16A.

Referring to FIGS. 16A and 16B, backside trenches 79 can be formed through the first and second alternating stacks (132, 142, 232, 242) between the memory blocks 101 (shown in FIG. 1) in the memory array region 100 and the word line contact via region 200. For example, the backside trenches can be formed between each neighboring pair of blocks of the memory stack structures 55 by forming and patterning a photoresist layer to form linear openings therein, and by transferring the pattern of the linear openings in the photoresist layer through the second tier structure (232, 242, 265) and the first tier structure (132, 142, 165). A top surface of the planar semiconductor layer 10 can be physically exposed at the bottom of each backside trench. In one embodiment, each backside trench 79 can extend along a first horizontal direction hd1 (e.g., word line direction) so that blocks of the memory stack structures 55 are laterally spaced along a second horizontal direction hd2 (e.g., bit line direction) that is different from the first horizontal direction.

Figure 17:
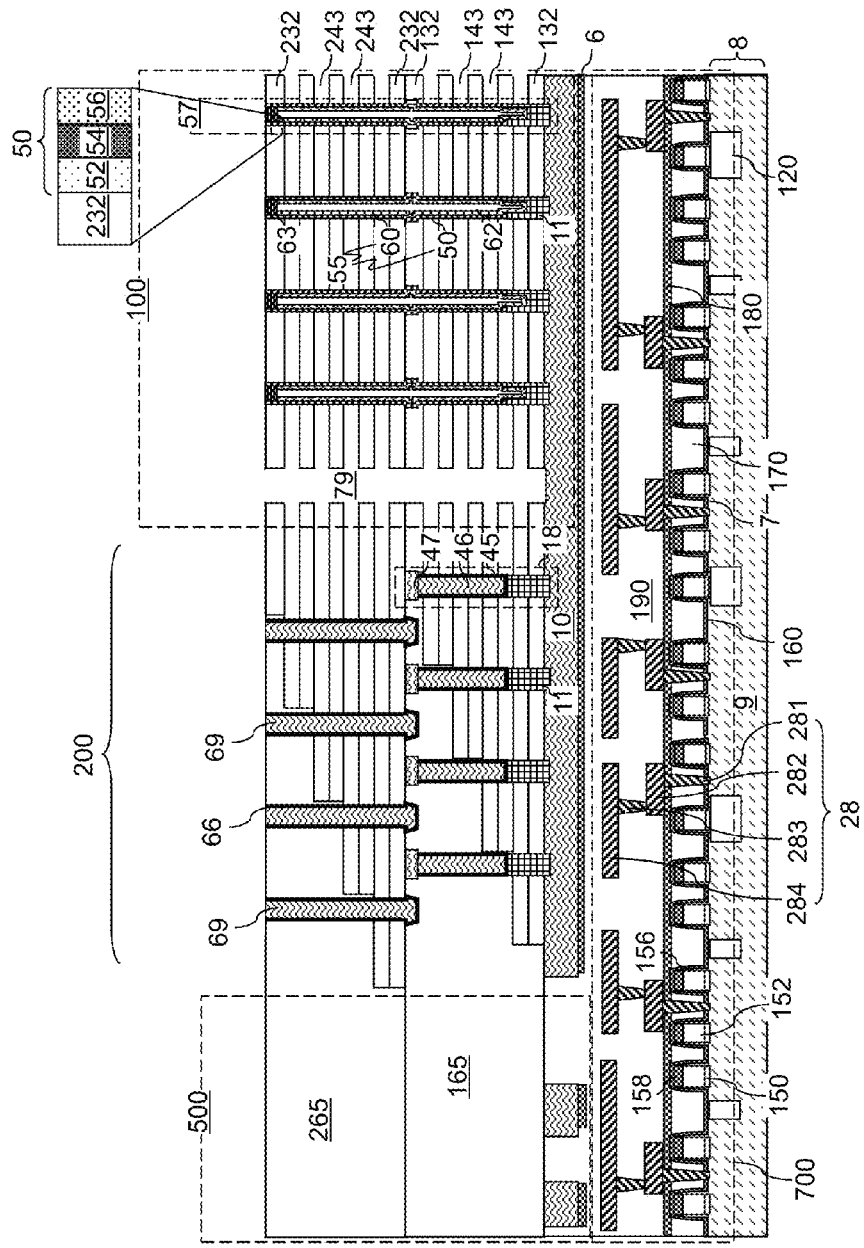
FIG. 17 is a vertical cross-sectional view of the exemplary structure after formation of backside recesses according to an embodiment of the present disclosure.

Referring to FIG. 17, an isotropic etch process can be performed to introduce an etchant that selectively etches the materials of the sacrificial material layers (142, 242) with respect to the materials of the insulating layers (132, 232) into the backside trenches 79. The etch process can remove the materials of the sacrificial material layers (142, 242) selective to the material and the outermost layer of the memory stack structures 55 and the support pillar structures 18. A wet etch process employing a wet etch solution, or a gas phase (dry) etch process in which the etchant is introduced in a vapor phase into the backside trenches can be employed to remove the materials of the sacrificial material layers (142, 242). For example, if the sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art. First backside recesses 143 are formed in volumes from which the first sacrificial material layers 142 are removed. Second backside recesses 243 are formed in volumes from which the second sacrificial material layers 242 are removed.

Each of the plurality of backside recesses (143, 243) can extend substantially parallel to the top surface of the planar semiconductor layer 10. Each backside recess (143, 243) can be vertically bounded by a top surface of an underlying insulating layer (132 or 232) and a bottom surface of an overlying insulating layer (132 or 232). In one embodiment, each backside recess (143, 243) can have a uniform height throughout. Alternatively, the backside recesses (143, 243) may have height variations.

In case semiconductor pedestals 11 are present underneath each memory stack structure 55 and at the bottom of each support pillar structure 18, physically exposed surface portions of semiconductor pedestals 11 can be converted into dielectric material portions by thermal conversion and/or plasma conversion of the semiconductor materials into dielectric materials to form dielectric spacers. In one embodiment, each dielectric spacer can be topologically homeomorphic to a torus, i.e., generally ring-shaped. As used herein, an element is topologically homeomorphic to a torus if the shape of the element can be continuously stretched without destroying a hole or forming a new hole into the shape of a torus.

Figure 18:
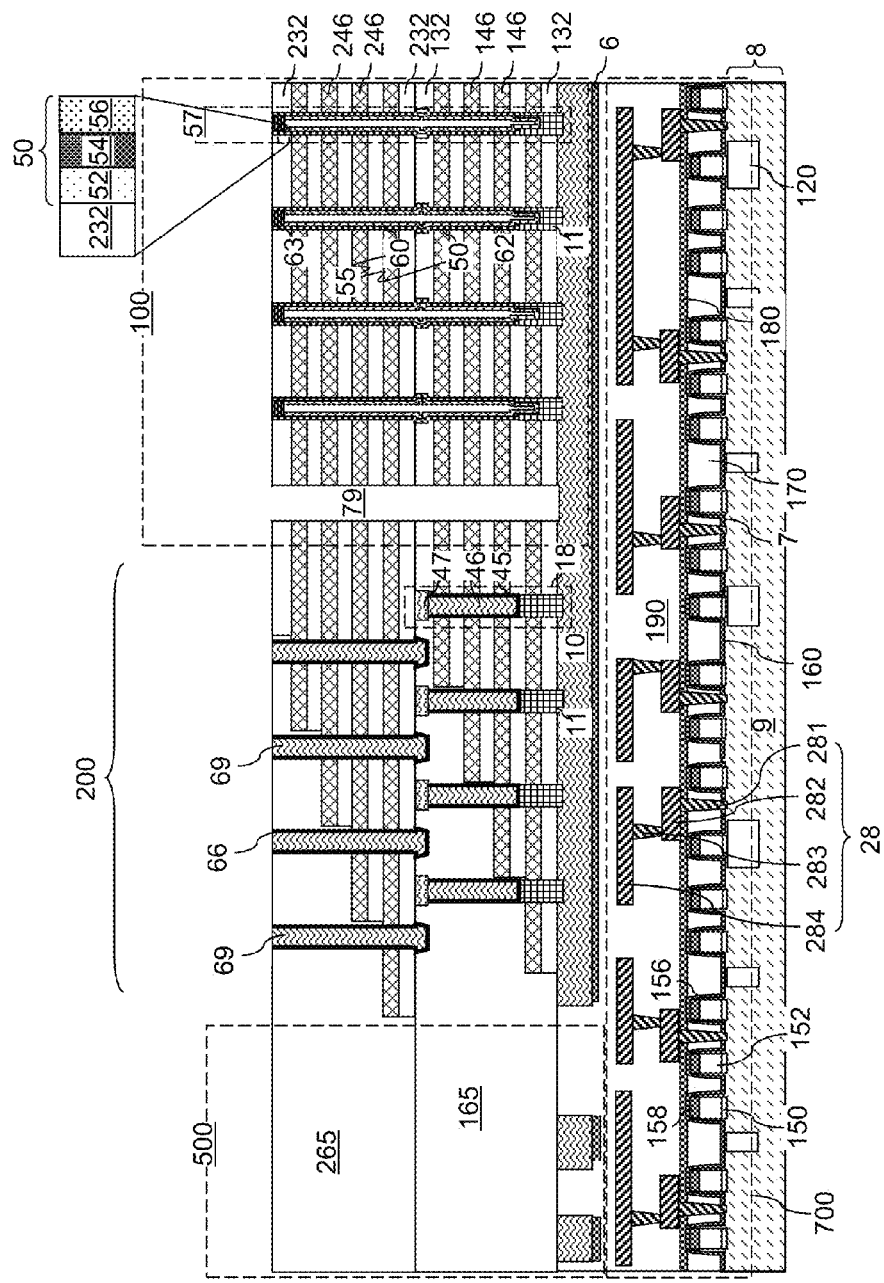
FIG. 18 is a vertical cross-sectional view of the exemplary structure after formation of electrically conductive layers in the backside recesses according to an embodiment of the present disclosure.

Referring to FIG. 18, a backside blocking dielectric layer (not shown) may be optionally formed in the backside recesses (143, 243). At least one conductive material can be deposited in the plurality of backside recesses (143, 243), on the sidewalls of each backside trench 79, and over the top surface of the second tier structure. In one embodiment, the conductive material can include at least one metallic material such as a conductive metallic nitride (e.g., TiN), at least one elemental metal (W, Cu, Al), and/or an intermetallic alloy.

A plurality of electrically conductive layers (146, 246) can be formed in the plurality of backside recesses (143, 243), and a continuous metallic material layer can be formed on the sidewalls of each backside trench and over the second tier structure (232, 246, 265). The plurality of electrically conductive layers (146, 246) includes first electrically conductive layers 146 that are formed in the first backside recesses 143 and second electrically conductive layers 246 that are formed in the second backside recesses 243. A backside cavity is present in the portion of each backside trench 79 that is not filled with the backside blocking dielectric layer and the continuous metallic material layer. The deposited metallic material of the continuous metallic material layer is etched back from the sidewalls of each backside trench and from above the second insulating cap layer for example, by an isotropic or anisotropic etch. Each remaining portion of the deposited metallic material in the backside recesses constitutes an electrically conductive layer (146, 246). Each electrically conductive layer (146, 246) can be a conductive line structure.

The first electrically conductive layers 146 replace the first sacrificial material layers 142, and second electrically conductive layers 246 replace the second sacrificial material layers 242. Each electrically conductive layer (146, 246) can function as a combination of a plurality of control gate electrodes located at a same level and a word line electrically interconnecting, i.e., electrically shorting, the plurality of control gate electrodes located at the same level. The plurality of control gate electrodes within each electrically conductive layer (146, 246) are the control gate electrodes for the vertical memory devices including the memory stack structures 55. In other words, each electrically conductive layer (146, 246) can be a word line that functions as a common control gate electrode for the plurality of vertical memory devices.

Figure 19:
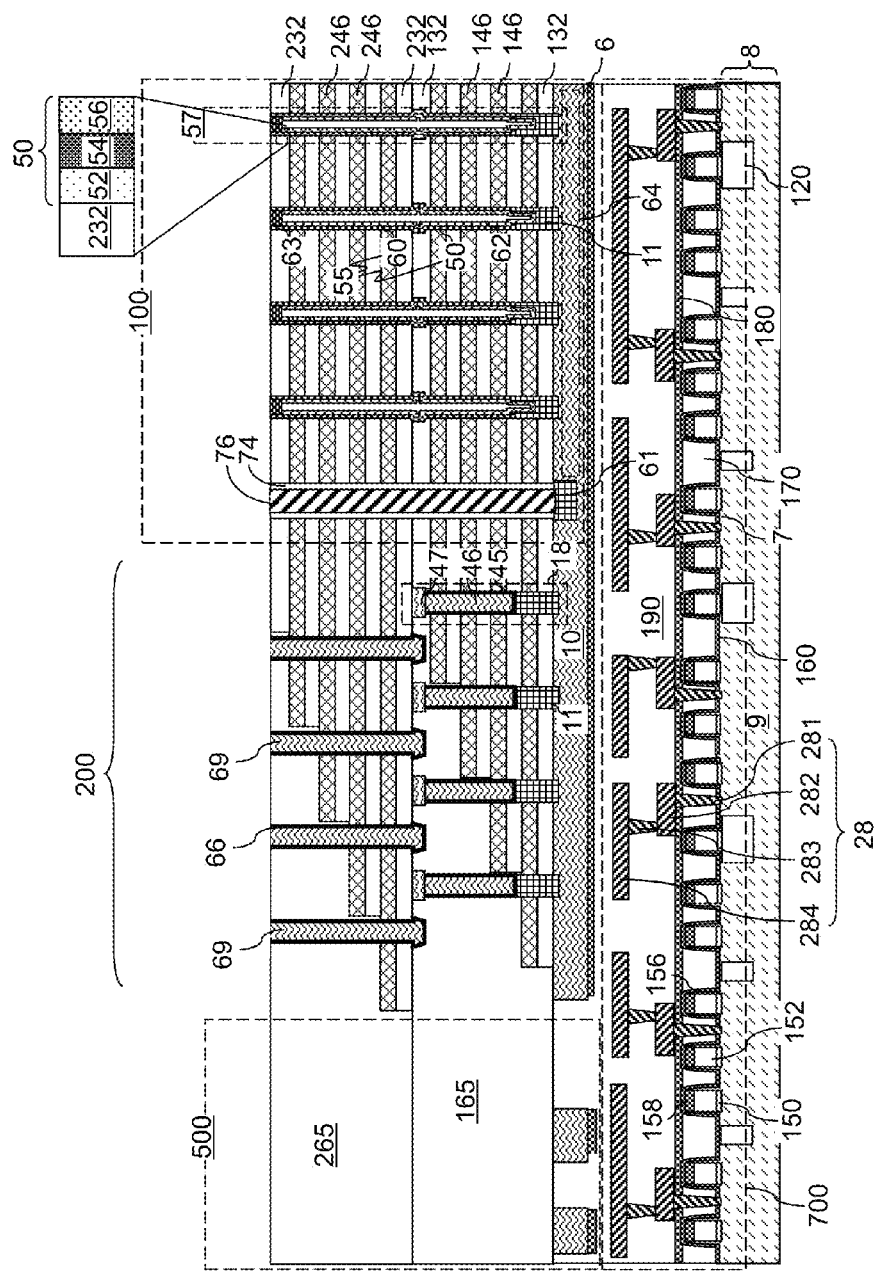
FIG. 19 is a vertical cross-sectional view of the exemplary structure after formation of an insulating spacer and a backside contact via structure within each backside trench according to an embodiment of the present disclosure.

Referring to FIG. 19, an insulating material layer can be formed in the at least one backside trench 79 and over the second alternating stack (232, 246) which includes the second insulating layers 232 and the second electrically conductive layers 246 at this processing step. The insulating material layer can be deposited by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the second alternating stack (232, 246) and at the bottom of each backside trench 79. Each remaining portion of the insulating material layer constitutes an insulating spacer 74. A backside cavity is present within a volume surrounded by each insulating spacer 74.

A source region 61 can be formed at a surface portion of the planar semiconductor layer 10 under each backside cavity by implantation of electrical dopants into physically exposed surface portions of the planar semiconductor layer 10. Each source region 61 is formed in a surface portion of the planar semiconductor layer 10 that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the planar semiconductor layer 10 that extends between the source region 61 and the plurality of semiconductor pedestals 11 constitutes a horizontal semiconductor channel 64 for a plurality of field effect transistors. The horizontal semiconductor channel 64 is connected to multiple vertical semiconductor channels 60 through respective semiconductor pedestals 11. The horizontal semiconductor channel 64 contacts the source region 61 and the plurality of semiconductor pedestals 11. A bottommost first electrically conductive layer 146 can comprise a select gate electrode for the field effect transistors. Each source region 61 is formed in an upper portion of the semiconductor planar semiconductor layer 10. Semiconductor channels (64, 11, 60) extend between each source region 61 and a respective set of drain regions 63. The semiconductor channels (64, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the second alternating stack (232, 242) as a stopping layer. If chemical mechanical planarization (CMP) process is employed, the second alternating stack (232, 242) can be employed as a CMP stopping layer. Each remaining continuous portion of the at least one conductive material in the backside trenches 79 constitutes a backside contact via structure 76.

Figure 20:
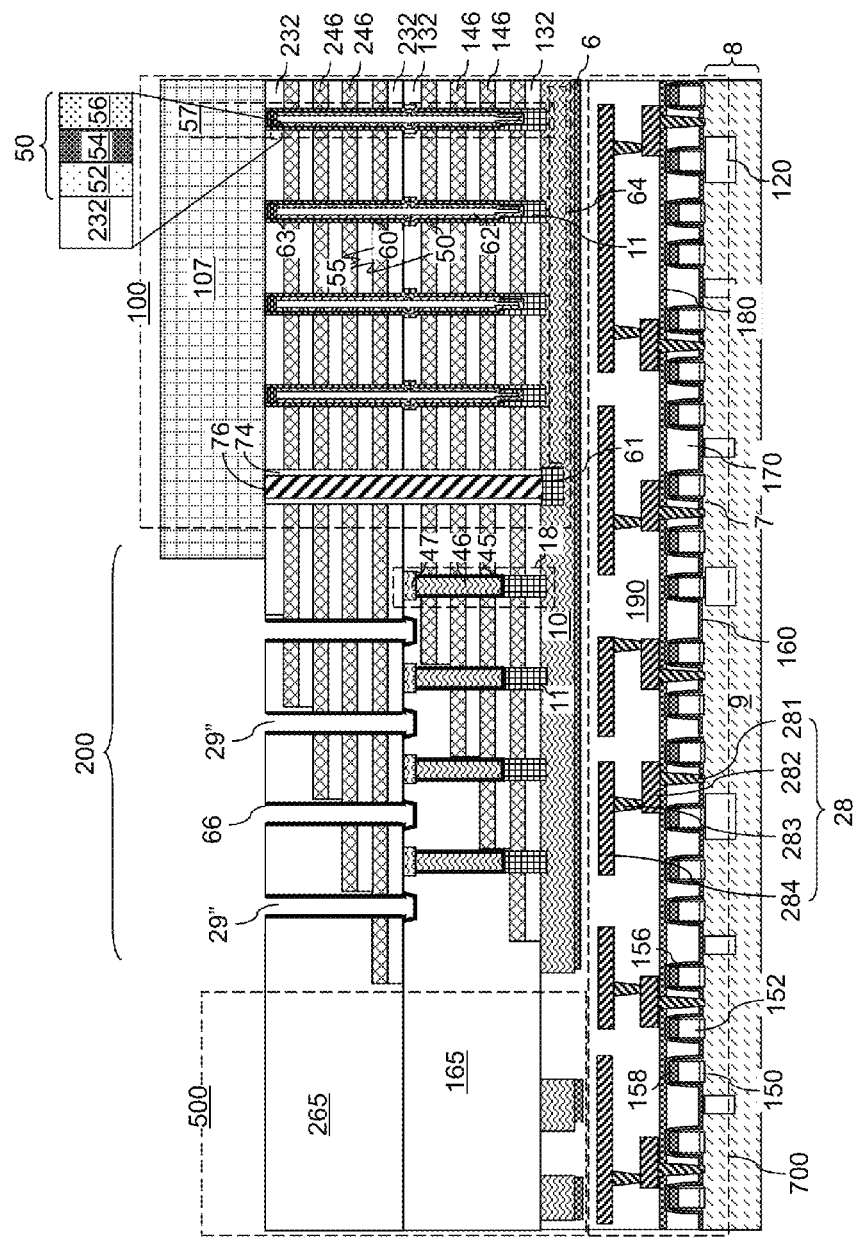
FIG. 20 is a vertical cross-sectional view of the exemplary structure after removal of sacrificial via structures according to an embodiment of the present disclosure.

Referring to FIG. 20, a photoresist layer 107 is applied over the exemplary structure and is lithographically patterned to cover the memory array region 100, and not cover the word line contact via region 200. The mask for patterning the photoresist layer 107 can be a block level mask, and the photoresist layer 107 can be patterned by mid ultraviolet (MUV) lithography. The sacrificial via structures 69 can be removed selective to the insulating spacers 66 and the material of the topmost second insulating layer 232. For example, if the sacrificial via structures 69 include amorphous silicon, the sacrificial via structures 69 can be removed by a wet etch employing a KOH solution or by a dry etch employing HCL or a fluorocarbon-containing etchant gas. First upper via cavities 29" are formed in volumes from which the sacrificial via structures 69 are removed. The first upper via cavities 29" can vertically extend through the entire thickness of the second tier structure (232, 246, 265) and into an upper portion of the first retro-stepped dielectric material portion 165. The photoresist layer 107 can be subsequently removed, for example, by ashing.

Figure 21:
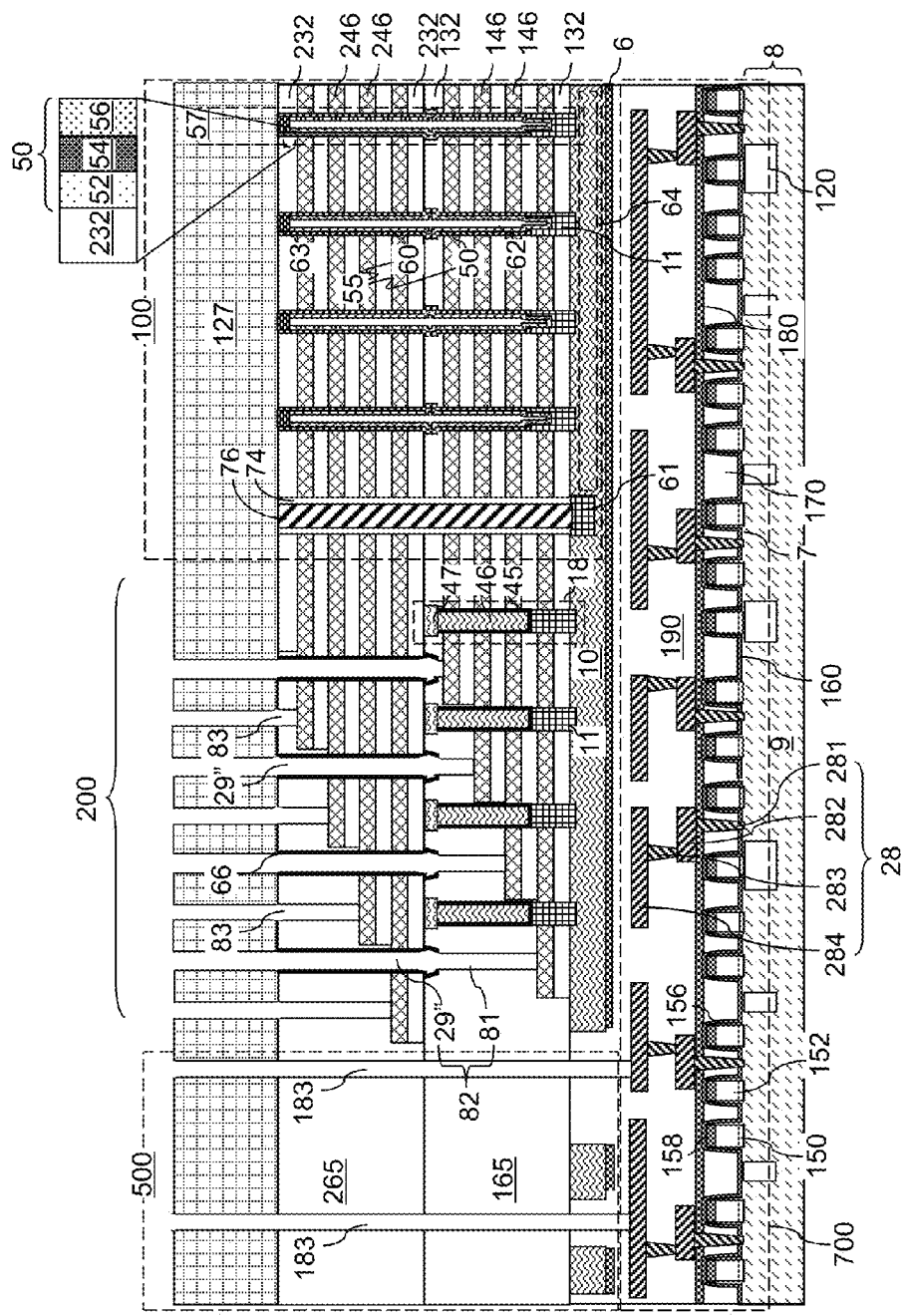
FIG. 21 is a vertical cross-sectional view of the exemplary structure after formation of contact via cavities according to an embodiment of the present disclosure.

Referring to FIG. 21, a photoresist layer 127 can be applied over the exemplary structure, and can be lithographically patterned to form openings therein. The openings in the patterned photoresist layer 127 includes first type openings that overlap in area with the first upper via cavities 29" and located in the word line contact via region 200, second type openings that do not overlap in area with the first upper via cavities 29" and located in the word line contact via region 200, and third type openings that overlie gaps in the planar semiconductor layer 10 and are formed in the through-memory-level via region 500. The areas of the second type openings are selected that the each area of the second type openings overlies a respective horizontal surface within the second stepped terraces in the second tier structure (232, 246, 265), i.e., a top surface of a respective one of the second electrically conductive layers 246 that contacts a respective bottom surface of the second retro-stepped dielectric material portion 265.

The pattern of the openings in the photoresist layer 127 can be transferred through horizontal portions of the insulating spacers 66, underlying portions of the first retro-stepped dielectric material portion 165, underlying portions of the second retro-stepped dielectric material portion 265, and the at least one lower-interconnect-level dielectric material layer (160, 170, 180, 190) by an anisotropic etch process that is selective to the material of the first and second electrically conductive layers (146, 246), selective to the materials of the lower-interconnect-level metal interconnect structures 28, and optionally selective to the material of the semiconductor material of the substrate semiconductor layer 9 in case at least one of the via cavities to be formed extends to a top surface of the substrate semiconductor layer 9. In other words, the photoresist layer 127 functions as an etch mask, the first and second electrically conductive layers (146, 246) function as etch stop layers for the anisotropic etch process within the word line via contact region 200, and the lower-interconnect-level metal interconnect structures 28 and optionally the semiconductor material of the substrate semiconductor layer 9 function as etch stop layers for the anisotropic etch process within the through-memory-level via region 500.

A lower via cavity 81 is formed underneath each first upper via cavity 29" by the anisotropic etch. Each adjoined pair of a first upper via cavity 29" and a lower via cavity 81 is herein referred to as a first contact via cavity 82. Each first contact via cavity 82 vertically extends through the entirety of the second tier structure (232, 246, 265) and the first retro-stepped dielectric material portion 165. A top surface of a first electrically conductive layer 146 is physically exposed at the bottom of each first contact via cavity 82. Each remaining portion of the insulating spacers 66 has a tubular shape with an optional bulge that protrudes outward at a top portion of the first retro-stepped dielectric material portion 165. Each insulating spacer 66 laterally surrounds an upper portion of a respective first contact via cavity 82, but does not laterally surround a lower portion of the first contact via cavity 82.

A second upper via cavity 83 is formed underneath the second type openings in the photoresist layer 127. Each second upper via cavity 83 is a second contact via cavity that extends through the second retro-stepped dielectric material portion 265. A top surface of a second electrically conductive layer 246 is physically exposed at the bottom of each second contact via cavity. The second upper via cavities 83, i.e., the second contact via cavities, can be formed concurrently with formation of the lower via cavities 81 employing a same anisotropic etch process.

Through-memory-level via cavities 183 can be optionally formed underneath the third type openings in the photoresist layer 127 concurrently with formation of the second upper via cavities 83 and the lower via cavities 81. The through-memory-level via cavities 183 extend through the second retro-stepped dielectric material portion 265 and the first retro-stepped dielectric material portion 165, and at least partly through the at least one lower-interconnect-level dielectric material layer (160, 170, 180, 190). In one embodiment, a top surface of one of the lower-interconnect-level metal interconnect structures 28 or a portion of the top surface of the substrate semiconductor layer 9 can be physically exposed at the bottom of each through-memory-level via cavities 183. The levels of the optional planar material layer 6, the planar semiconductor layer 10, the first tier structure (132, 146, 165), and the second tier structure (232, 246, 265) collectively constitute the memory level. The photoresist layer 127 can be subsequently removed, for example, by ashing.

Figure 22A:
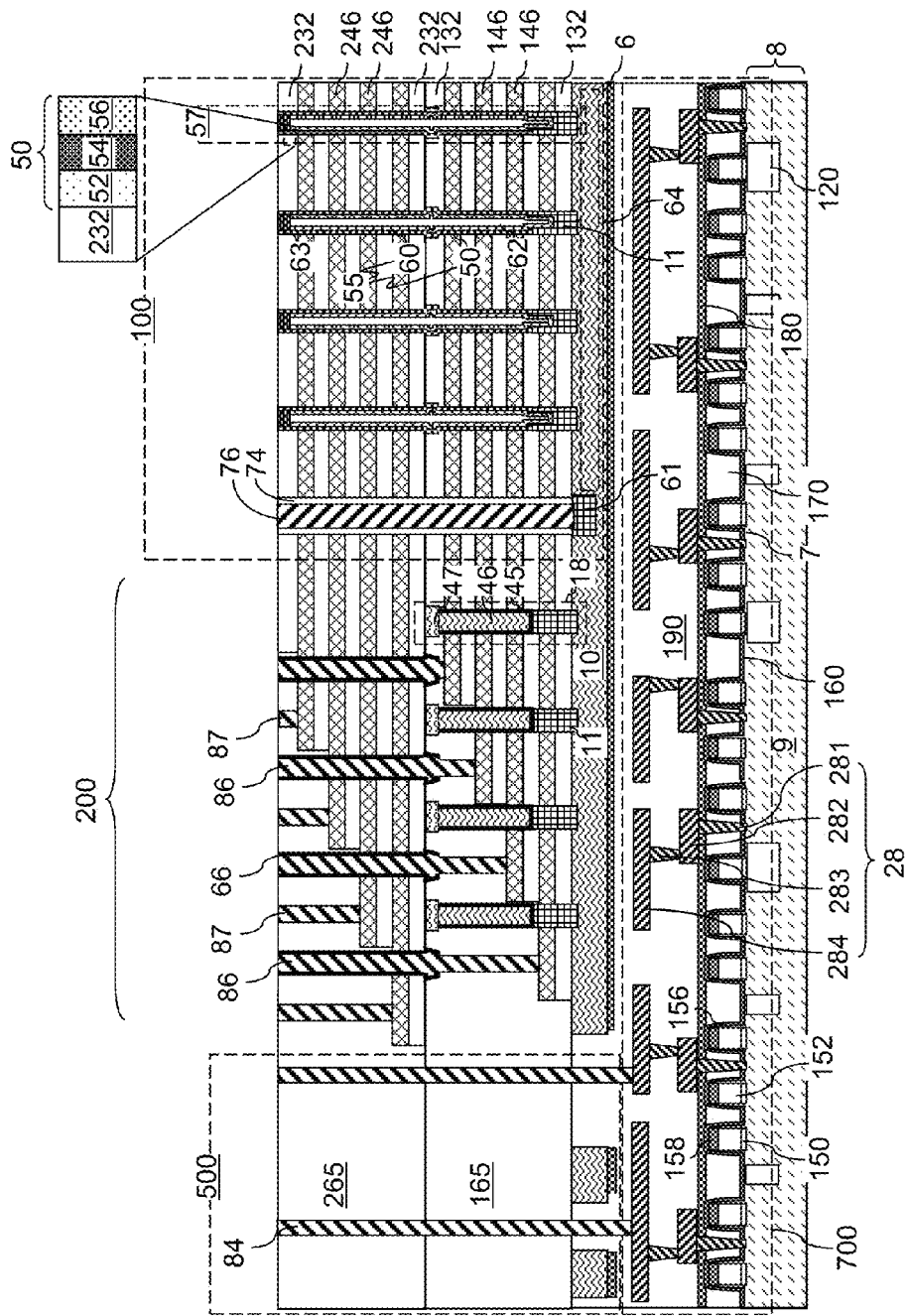
FIG. 22A is a vertical cross-sectional view of the exemplary structure after formation of various contact via structures according to an embodiment of the present disclosure.
Figure 22B:
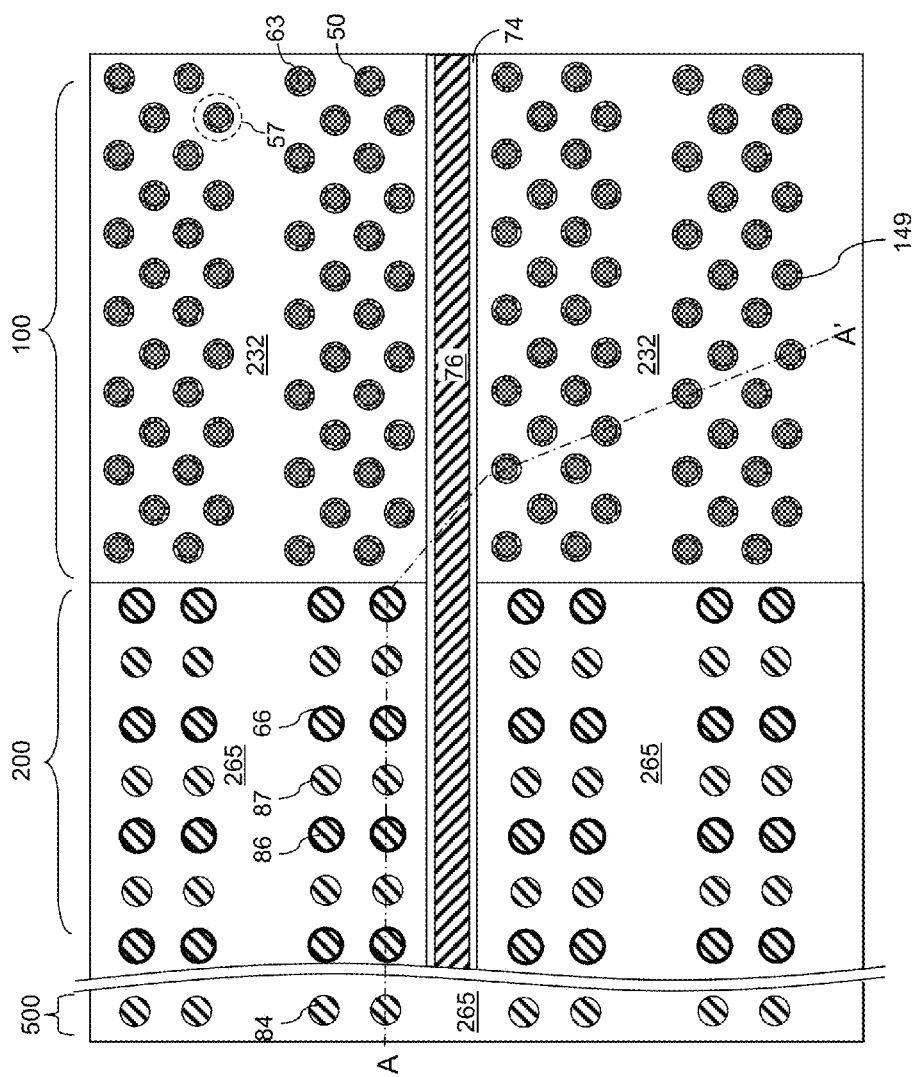
FIG. 22B is a top-down view of the exemplary structure of FIG. 22A.
Figure 22C:
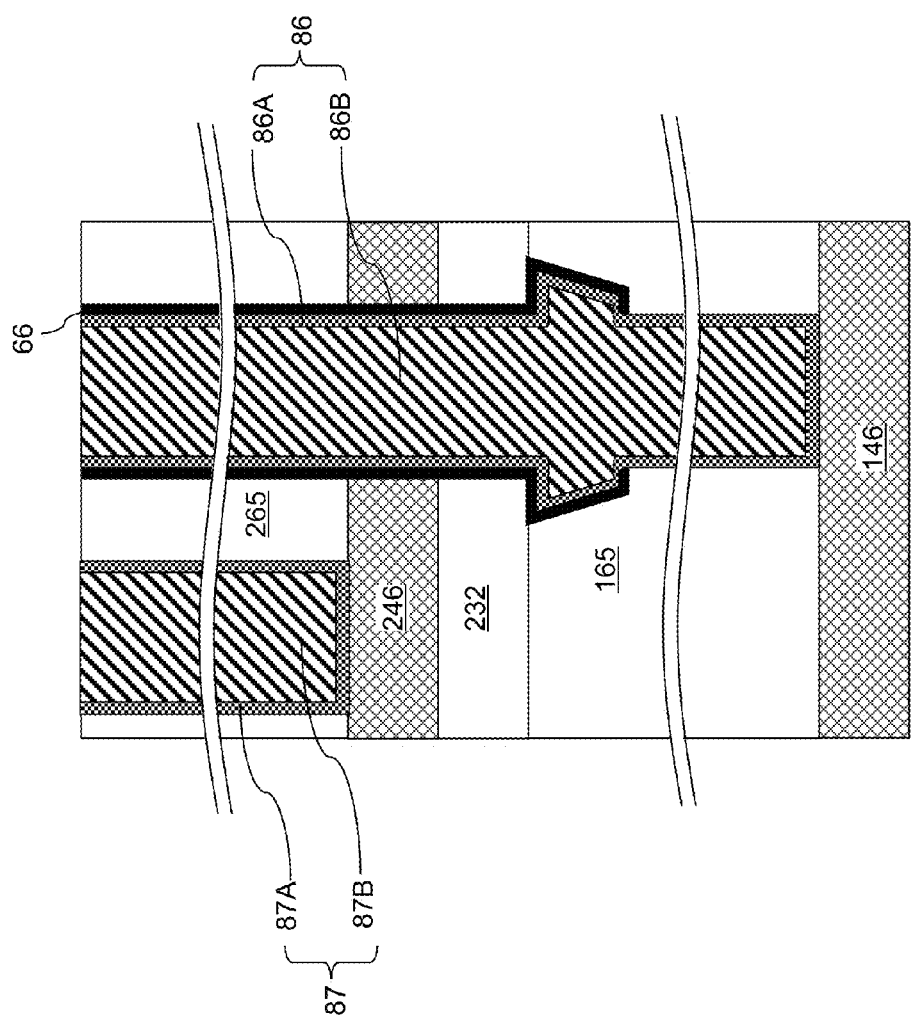
FIG. 22C is a magnified view of a pair of a first contact via structure and a second contact via structure within the exemplary structure of FIGS. 22A and 22B.

Referring to FIGS. 22A-22C, at least one conductive material is deposited in each of the first contact via cavities 82, the second contact via cavities 83, and the through-memory-level via cavities 183. For example, a metallic barrier material such as TiN, TaN, WN, TiC, TaC, or WC can be deposited in the various via cavities (82, 83, 183) followed by deposition of a conductive fill material, which can include a metallic material such as tungsten, copper, cobalt, molybdenum, aluminum, or an intermetallic alloy and/or a doped semiconductor material. Excess portions of the at least one conductive material can be removed from above the top surface of the second tier structure (232, 246, 265) by a planarization process such as chemical mechanical planarization and/or a recess etch.

Each remaining portion of the at least one conductive material in the first contact via cavities 82 constitutes a first contact via structure 86. As shown in FIG. 22C, each first contact via structure 86 can include a first metallic liner 86A including the metallic barrier material and a first conductive fill material portion 86B including the conductive fill material. Each first contact via structure 86 physically contacts a top surface of a respective one of the first electrically conductive layers 146. Each remaining portion of the at least one conductive material in the second contact via cavities 83 constitutes a second contact via structure 87. Each second contact via structure 87 can include a second metallic liner 87A including the metallic barrier material and a second conductive fill material portion 87B including the conductive fill material. Each second contact via structure 87 physically contacts a top surface of a respective one of the second electrically conductive layers 246. Each remaining portion of the at least one conductive material in the through-memory-level via cavities 183 constitutes a through-memory-level contact via structure 84. Each first contact via structure 84 can physically contacts a top surface of a lower-interconnect-level metal interconnect structures 28 or a component of any semiconductor device located on the substrate semiconductor layer 9.

The first contact via structures 86, the second contact via structures 87, and the through-memory-level contact via structures 84 can be concurrently formed by a same deposition process and a same planarization process. The first contact via structures 86 are first tier word line contacts that are formed through the first retro-stepped dielectric material portion 165 and the second retro-stepped dielectric material portion 265. The second contact via structures 87 are second tier word line contacts that are formed through the second retro-stepped dielectric material portion 265. The through-memory-level contact via structures 84 are peripheral device contacts that are formed through the first tier structure (132, 146, 165) and the second tier structure (232, 246, 265). One or more of the through-memory-level contact via structures 84 can be electrically shorted to a respective one of the lower-interconnect-level metal interconnect structures 28.

Figure 23:
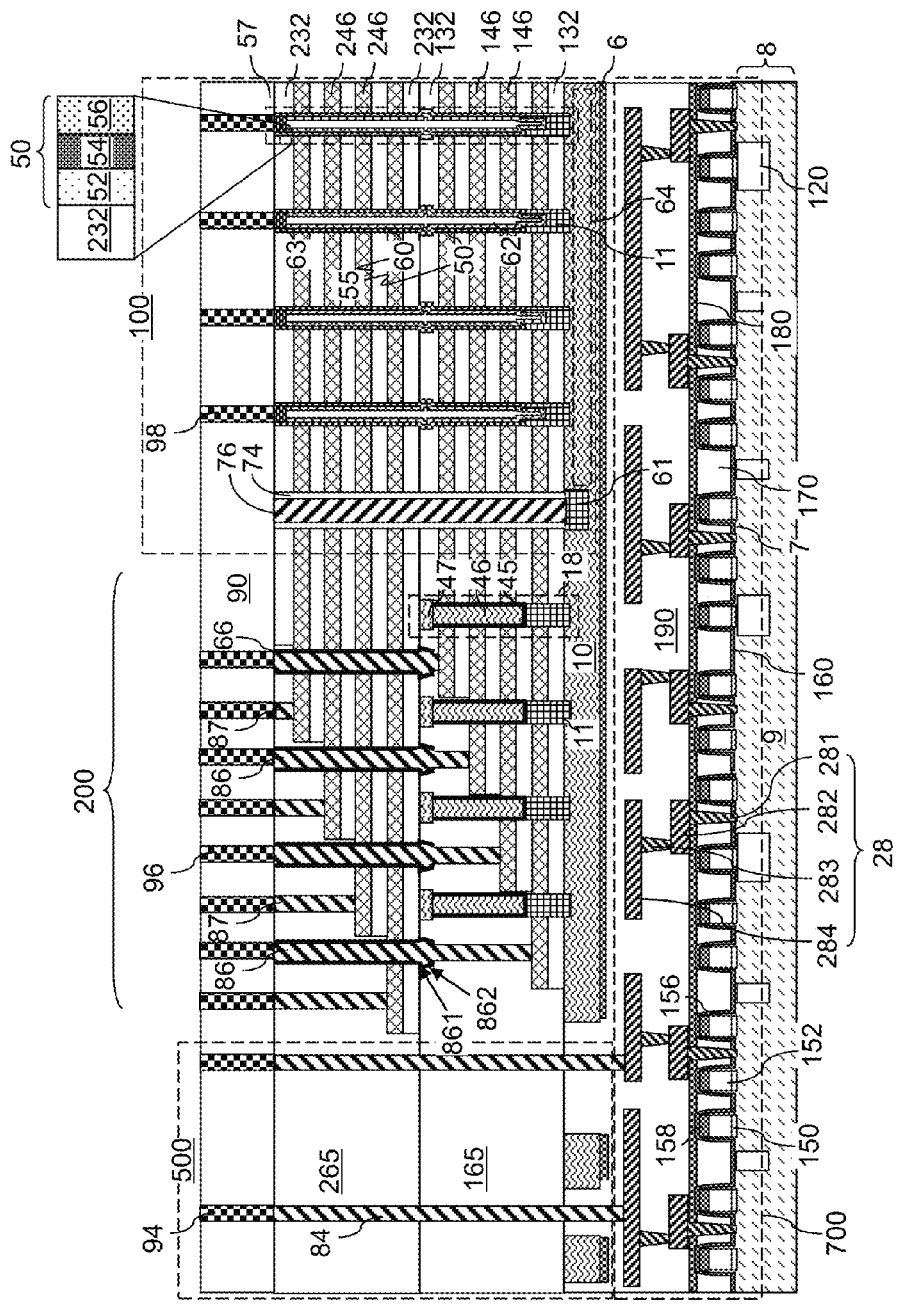
FIG. 23 is a vertical cross-sectional view of the exemplary structure after formation of upper metal interconnect structures according to an embodiment of the present disclosure.

Referring to FIG. 23, at least one upper-interconnect-level dielectric material layer 90 can be deposited over the second tier structure (232, 246, 265). The at least one upper-interconnect-level dielectric material layer 90 can include any interlayer dielectric (ILD) material such as silicon oxide, silicon nitride, organosilicate glass, other low dielectric constant (low-k) dielectric materials, and optional dielectric metal oxide liners. Upper-interconnect-level metal interconnect structures (98, 96, 94) can be formed in the at least one upper-interconnect-level dielectric material layer 90 and over the second tier structure (232, 246, 265). The upper-interconnect-level metal interconnect structures (98, 96, 94) can include bit line connection structures 98, which may include drain contact via structures that physically contact the drain regions 63 and bit lines that laterally extend along the second horizontal direction hd2 over the array of memory stack structures 55. The upper-interconnect-level metal interconnect structures (98, 96, 94) can include word line connection structures 96, which can include metal lines that provide electrical connection between the word line decoder 702 shown in FIG. 1 and the first and second electrically conductive layers (146, 246) through the first and second contact via structures (86, 87). Further, the upper-interconnect-level metal interconnect structures (98, 96, 94) can include peripheral connection structures 94, which can be electrically connected to the through-memory-level contact via structures 84.

A subset of the peripheral connection structures 94 may be electrically shorted to, and/or may be formed integrally with (as a single continuous structure), a subset of the word line connection structures 96 such that the word lines of the vertical NAND memory device, as implemented by the first and second electrically conductive layers (146, 246), can be driven by the peripheral semiconductor devices on the substrate semiconductor layer 9. Alternatively or additionally, another subset of the peripheral connection structures 94 may be electrically shorted to, and/or may be formed integrally with (as a single continuous structure), a subset of the bit line connection structures 98 such that the drain regions 63 overlying the memory stack structures 55 can be driven by the semiconductor devices on the substrate semiconductor layer 9.

Figure 24:
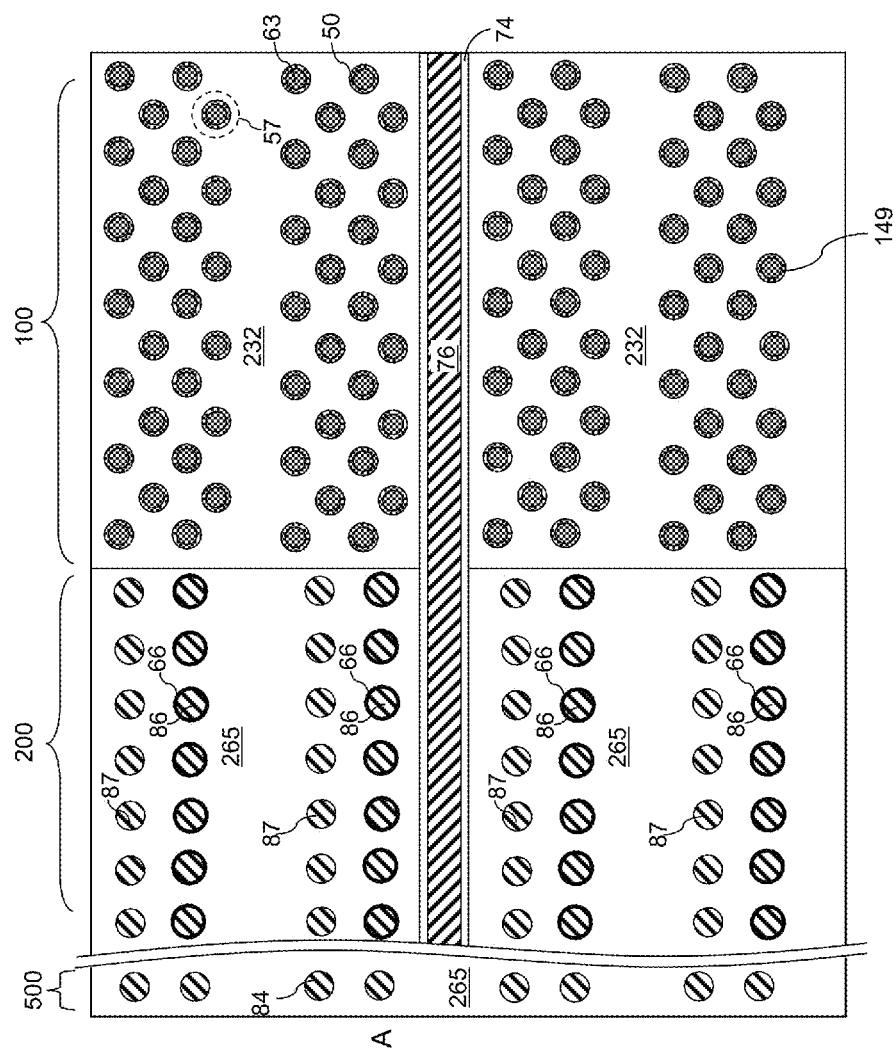
FIG. 24 is a top-down view of an alternative configuration of the exemplary structure at a processing step of FIGS. 22A-22C.

FIG. 24 illustrates an alternative configuration of the exemplary structure, and may be a top-down view at the processing steps of FIGS. 22A-22C. Generally, locations of the first contact via structures 86 and the second contact via structures 87 can be rearranged as long as electrical contact is provided to each first electrically conductive layer 146 and to each second electrically conductive layer 246 through the first contact via structures 86 and the second contact via structures 87, respectively. The configuration illustrated in FIG. 24 provides a row of first contact via structures 86 in parallel with a row of second contact via structures 87, and may provide more efficient layout that consumes less area for placement of the first contact via structures 86 and the second contact via structures 87 in view of the required electrical wiring, i.e., the word line connection structures 96 that need to be formed over the first contact via structures 86 and the second contact via structures 87. Additional alternative layouts and/or configurations of the first contact via structures 86 and the second contact via structures 87 may be employed as needed.

The exemplary structure, or alternative configurations thereof, can include a three-dimensional memory device. The three-dimensional memory device includes a first tier structure (132, 146, 165) including a first alternating stack (132, 146) of first insulating layers 132 and first electrically conductive layers 146 that is located over a top surface of a substrate 8 and having a first terrace region having first steps. A second tier structure (232, 246, 265) includes a second alternating stack (232, 246) of second insulating layers 232 and second electrically conductive layers 246 that overlies the first tier structure (132, 146, 165) and having a second terrace region having second steps that overlies (i.e., located above, such as having an areal overlap with) the first steps of the first terrace region in a plan view along a direction perpendicular to the top surface of the substrate 8. A memory array region 100 is located adjacent to the first terrace region and the second terrace region and including memory stack structures 55 that extend through the first alternating stack (132, 146, 165) and the second alternating stack (232, 246, 265). Each of the memory stack structures 55 comprises a memory film 50 and a vertical semiconductor channel 60. First contact via structures 86 vertically extend through the second tier structure (232, 246, 265) in the second terrace region and extend into the first tier structure (132, 146, 165) in the first terrace region and contacting a respective one of the first electrically conductive layers 146.

In one embodiment, each first electrically conductive layer 146 except a topmost first electrically conductive layer 146 has a greater lateral extent than any overlying first electrically conductive layer 146. The first tier structure (132, 146, 165) comprises a first retro-stepped dielectric material portion 165 contacting the first steps (i.e., the first stepped surface) of the first terrace region, and the second tier structure (232, 246, 265) comprises a second retro-stepped dielectric material portion 265 contacting the second steps (i.e., the second stepped surface) of the second terrace region. The first contact via structures 86 extend through the first retro-stepped dielectric material portion 165 and the second retro-stepped dielectric material portion 265. In one embodiment, each of the first contact via structures 86 is laterally surrounded by a respective insulating spacer 66 extending through the second retro-stepped dielectric material portion 265, a respective portion of the second alternating stack (232, 246), and an upper portion of the first retro-stepped dielectric material portion 165.

In one embodiment, the respective insulating spacer 66 contacts sidewalls of a subset of the second electrically conductive layers 246. In one embodiment, the respective insulating spacer 66 comprises: a vertically extending tubular portion that extends through the second tier structure (232, 246, 265), and a laterally protruding portion having a greater lateral extent than the vertically extending tubular portion, including a respective horizontal surface 861 that contacts a respective portion of a bottom surface of the second retro-stepped dielectric material portion 265, and including a respective sidewall surface 862 that contact a respective surface of the first retro-stepped dielectric material portion 165. In one embodiment, sidewalls of the first contact via structures 86 contact surfaces of the first retro-stepped dielectric material portion 165.

The three-dimensional memory device can further comprise second contact via structures 87 extending through the second retro-stepped dielectric material portion 265 and contacts a top surface of a respective one of the second electrically conductive layers 246 in the second terrace region. In one embodiment, each of the first contact via structures 86 can comprise a metallic liner 86A extending continuously from a horizontal plane including a top surface of the second retro-stepped dielectric material portion 265 to a top surface of a respective first electrically conductive layer 146, and a metallic fill material portion 86B extending continuously from the horizontal plane including the top surface of the second retro-stepped dielectric material portion 265 and contacting a top surface of a horizontal portion of the metallic liner 86A overlying the top surface of the respective first electrically conductive layer 146. The metallic liner 86A and the metallic fill material portion 86B can comprise a respective laterally protruding portion embedded within the first retro-stepped dielectric material portion 165 and underlying the second tier structure (232, 246, 265).

In one embodiment, support pillar structures 18 can be embedded within the first tier structure (132, 146, 165), underlie a bottom surface of the second tier structure (232, 246, 265), and extend through the first steps (i.e., stepped surface) in the first terrace region. Preferably, no support pillar structures are located in the second terrace region. In one embodiment, each of the memory stack structures 55 can comprise a memory film 50 that includes a blocking dielectric layer 52, a charge trapping layer 54, and a tunneling dielectric layer 56 and overlies a respective instance of a semiconductor pedestal 11. Each of the support pillar structures 18 can comprise a support opening fill material portion 46 that overlies a respective instance of the semiconductor pedestal 11. Each of the support pillar structures lacks a memory film, and the first and the second electrically conductive layers (146, 246) comprise word lines.

The three dimensional memory device can further comprise at least one lower-interconnect-level dielectric material layer (160, 170, 180, 190) located between the substrate 8 and the first tier structure (132, 146, 165) and embedding lower-interconnect-level metal interconnect structures 28, at least one upper-interconnect-level dielectric material layer 90 located above the second tier structures (232, 246, 265) and embedding upper-interconnect-level metal interconnect structures (98, 96, 94), and through-memory-level contact via structures 84 electrically shorted to a respective one of the lower-interconnect-level metal interconnect structures 28 and a respective one of the upper-interconnect-level metal interconnect structures (98, 96, 94).

In one embodiment, the three-dimensional memory device is a monolithic three-dimensional memory device comprising a vertical NAND device located over the semiconductor substrate, the first and second electrically conductive layers (146, 246) comprise, or are electrically connected to, a respective word line of the vertical NAND device, the substrate 8 comprises a silicon substrate, and the vertical NAND device comprises an array of monolithic three-dimensional NAND strings located over the silicon substrate. At least one memory cell in a first device level of the three-dimensional array of NAND strings is located over another memory cell in a second device level of the three-dimensional array of NAND strings. The silicon substrate can contain an integrated circuit comprising a driver circuit for the memory device located thereon.

The array of monolithic three-dimensional NAND strings can comprise a plurality of semiconductor channels (64, 11, 60). At least one end portion (such as a respective vertical semiconductor channel 60) of each of the plurality of semiconductor channels extends substantially perpendicular to a top surface of the substrate semiconductor layer 9. The array of monolithic three-dimensional NAND strings can comprise a plurality of charge storage elements (as embodied as portions of the memory film 50). Each charge storage element can be located adjacent to a respective one of the plurality of semiconductor channel. The array of monolithic three-dimensional NAND strings can comprise a plurality of control gate electrodes having a strip shape extending substantially parallel to the top surface of the substrate semiconductor layer 9. The plurality of control gate electrodes comprise at least a first control gate electrode located in the first device level and a second control gate electrode located in the second device level.

The embodiments of the present disclosure provide the following non-limiting advantages. First, the area of the terrace regions (i.e., the word line contact via regions 200) can be reduced (e.g., by about 50%) due to the vertical overlap of the first and second terrace regions. Second, the lower part of the first contact via structures 86 located in the lower via cavities 81 in the first tier are margined with sacrificial second tier support pillar structures (66, 69) which are removed after formation of the second electrically conductive layers 246, means that the reactive ion etch depth of the lower via cavities 81 is reduced by about 50%. This reduces the time to complete the reactive ion etch, the process cost and the punch through risk during the reactive ion etch. Fourth, the lower and upper contact vias (81/82 and 83) for both the lower and upper tiers can be formed in one via etching step shown in FIG. 21 and the first and second contact via structures (86, 87) for both tiers can be formed on one deposition step shown in FIG. 22A, which further reduces the process cost.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a first tier structure including a first alternating stack of first insulating layers and first electrically conductive layers that is located over a top surface of a substrate and having a first terrace region containing first steps;
a second tier structure including a second alternating stack of second insulating layers and second electrically conductive layers that overlies the first tier structure and having a second terrace region containing second steps that overlies the first steps in the first terrace region;
a memory array region located adjacent to the first terrace region and the second terrace region and including memory stack structures that extend through the first alternating stack and the second alternating stack, wherein each of the memory stack structures comprises a memory film and a vertical channel; and
first contact via structures vertically extending through the second tier structure in the second terrace region and extending into the first tier structure in the first terrace region and contacting a respective one of the first electrically conductive layers.

2. The three-dimensional memory device of claim 1, wherein:
each first electrically conductive layer except a topmost first electrically conductive layer has a greater lateral extent than any overlying first electrically conductive layer in the first terrace region;
the second terrace region has an areal overlap with the first terrace region in a plan view along a direction perpendicular to the top surface of the substrate;
the first tier structure comprises a first retro-stepped dielectric material portion contacting the first steps of the first terrace region;
the second tier structure comprises a second retro-stepped dielectric material portion contacting the second steps of the second terrace region; and
the first contact via structures extend through the first retro-stepped dielectric material portion and the second retro-stepped dielectric material portion.

3. The three-dimensional memory device of claim 2, wherein each of the first contact via structures is laterally surrounded by a respective insulating spacer extending through an upper portion of the first retro-stepped dielectric material portion and through both the second retro-stepped dielectric material portion and a respective portion of the second alternating stack.

4. The three-dimensional memory device of claim 3, wherein the respective insulating spacer contacts sidewalls of a subset of the second electrically conductive layers.

5. The three-dimensional memory device of claim 3, wherein the respective insulating spacer comprises:

a vertically extending tubular portion that extends through the second tier structure; and a laterally protruding portion having a greater lateral extent than the vertically extending tubular portion, including a respective horizontal surface that contacts a respective portion of a bottom surface of the second retro-stepped dielectric material portion, and including a respective sidewall surface that contacts a respective surface of the first retro-stepped dielectric material portion.

6. The three-dimensional memory device of claim 2, wherein sidewalls of the first contact via structures contact surfaces the first retro-stepped dielectric material portion.

7. The three-dimensional memory device of claim 2, further comprising second contact via structures extending through the second retro-stepped dielectric material portion and contacting a top surface of a respective one of the second electrically conductive layers in the second terrace region.

8. The three-dimensional memory device of claim 2, wherein each of the first contact via structures comprises:

a metallic liner extending continuously from a horizontal plane including a top surface of the second retro-stepped dielectric material portion to a top surface of a respective first electrically conductive layer; and a metallic fill material portion extending continuously from the horizontal plane including the top surface of the second retro-stepped dielectric material portion and contacting a top surface of a horizontal portion of the metallic liner overlying the top surface of the respective first electrically conductive layer, wherein the metallic liner and the metallic fill material portion comprise a respective laterally protruding portion embedded within the first retro-stepped dielectric material portion and underlying the second tier structure.

9. The three-dimensional memory device of claim 2, further comprising support pillar structures embedded within the first tier structure and underlying a bottom surface of the second tier structure and extending through the first steps in the first terrace region, wherein no support pillar structures are located within the second terrace region.

10. The three-dimensional memory device of claim 9, wherein:

the memory film comprises a blocking dielectric layer, a charge trapping layer, and a tunneling dielectric layer;

the memory film overlies a respective instance of a semiconductor pedestal;

each of the support pillar structures comprises a support opening fill material portion that overlies a respective instance of the semiconductor pedestal;

each of the support pillar structures lacks a memory film; and the first and the second electrically conductive layers comprise word lines.

11. The three dimensional memory device of claim 2, further comprising:

at least one lower-interconnect-level dielectric material layer located between the substrate and the first tier structure and embedding lower-interconnect-level metal interconnect structures;

at least one upper-interconnect-level dielectric material layer located above the second tier structures and embedding upper-interconnect-level metal interconnect structures; and through-memory-level contact via structures electrically shorted to a respective one of the lower-interconnect-level metal interconnect structures and a respective one of the upper-interconnect-level metal interconnect structures.

12. The three-dimensional memory device of claim 1, wherein:

the three-dimensional memory device is a monolithic three-dimensional memory device comprising a vertical NAND device located over the semiconductor substrate;

the first and second electrically conductive layers comprise, or are electrically connected to, a respective word line of the vertical NAND device;

the substrate comprises a silicon substrate;

the vertical NAND device comprises an array of monolithic three-dimensional NAND strings located over the silicon substrate;

at least one memory cell in a first device level of the three-dimensional array of NAND strings is located over another memory cell in a second device level of the three-dimensional array of NAND strings;

the silicon substrate contains an integrated circuit comprising a driver circuit for the memory device located thereon; and the array of monolithic three-dimensional NAND strings comprises:

a plurality of vertical semiconductor channels, wherein at least one end portion of each of the plurality of vertical semiconductor channels extends substantially perpendicular to a top surface of the semiconductor substrate;

a plurality of charge storage elements, each charge storage element located adjacent to a respective one of the plurality of vertical semiconductor channels; and a plurality of control gate electrodes having a strip shape extending substantially parallel to the top surface of the semiconductor substrate, the plurality of control gate electrodes comprise at least a first control gate electrode located in a first device level and a second control gate electrode located in a second device level.

* * * * *